(12) United States Patent
Urquhart et al.

(10) Patent No.: US 7,871,249 B2
(45) Date of Patent: *Jan. 18, 2011

(54) SYSTEMS AND METHODS FOR MANAGING FLUIDS USING A LIQUID RING PUMP

(75) Inventors: Karl J. Urquhart, Allen, TX (US);
Georges Guarneri, Le Versoud (FR);
Jean-Louis Marc, La Redorte (FR);
Norbert Fanjat, Plano, TX (US);
Laurent Langellier, Dallas, TX (US);
Christophe Colin, Plano, TX (US)

(73) Assignees: Air Liquide Electronics U.S. LP, Dallas, TX (US); Air Liquide Electronics Systems SA, Paris (FR)

( * ) Notice: Subject to any disclaimer, the term of this patent is extended or adjusted under 35 U.S.C. 154(b) by 895 days.

This patent is subject to a terminal disclaimer.

(21) Appl. No.: 11/549,094

(22) Filed: Oct. 12, 2006

(65) Prior Publication Data

US 2007/0110591 A1 May 17, 2007

Related U.S. Application Data

(60) Continuation-in-part of application No. 11/533,826, filed on Sep. 21, 2006, and a continuation-in-part of application No. 11/107,494, filed on Apr. 15, 2005, now Pat. No. 7,344,297, which is a continuation-in-part of application No. 10/939,570, filed on Sep. 13, 2004, now abandoned, which is a division of application No. 09/468,411, filed on Dec. 20, 1999, now Pat. No. 6,799,883, which is a continuation-in-part of application No. 09/051,304, filed on Apr. 16, 1998, now Pat. No. 6,050,283.

(60) Provisional application No. 60/801,913, filed on May 19, 2006.

(51) Int. Cl.
*F04C 19/00* (2006.01)
*C03C 25/68* (2006.01)
*B01F 15/02* (2006.01)

(52) U.S. Cl. .......................... 417/68; 216/84; 366/132; 366/136; 366/151.1

(58) Field of Classification Search .................. 417/68, 417/69; 210/198.1; 216/84; 366/132, 136, 366/137, 142, 151.1, 152.1, 152.2
See application file for complete search history.

(56) References Cited

U.S. PATENT DOCUMENTS 1,522,120 A 1/1925 Halder
2,152,956 A 4/1939 Rudolf (Continued)

FOREIGN PATENT DOCUMENTS

EP 0 870 535 10/1998
EP 0 870 729 10/1998

(Continued)

OTHER PUBLICATIONS

International Search Report for PCT/IB2007/001250.

(Continued)

*Primary Examiner*—Charles G Freay
(74) *Attorney, Agent, or Firm*—Patricia E. McQueeney

(57) ABSTRACT

Methods and systems for chemical management. In one embodiment, a blender is coupled to a processing system and configured to supply an appropriate solution or solutions to the system. Solutions provided by the blender are then reclaimed from the system and subsequently reintroduced for reuse. The blender may be operated to control the concentrations of various constituents in the solution prior to the solution being reintroduced to the system for reuse. Some chemicals introduced to the system may be temperature controlled. A back end vacuum pump subsystem separates gases from liquids as part of a waste management system.

39 Claims, 11 Drawing Sheets

U.S. PATENT DOCUMENTS

| | | | | |
|---|---|---|---|---|
| 2,979,066 | A | 4/1961 | Christie | |
| 3,248,233 | A * | 4/1966 | Brent et al. | 99/352 |
| 3,366,061 | A * | 1/1968 | Adams | 137/154 |
| 3,402,729 | A | 9/1968 | Richmond et al. | |
| 3,954,567 | A * | 5/1976 | Fischer et al. | 203/86 |
| 4,315,717 | A | 2/1982 | King | |
| 4,359,313 | A | 11/1982 | Bernard | |
| 4,388,864 | A | 6/1983 | Warner | |
| 4,403,866 | A | 9/1983 | Falcoff et al. | |
| 4,405,656 | A | 9/1983 | Shimizu et al. | |
| 4,580,720 | A | 4/1986 | Strop et al. | |
| 4,655,688 | A * | 4/1987 | Bohn et al. | 417/18 |
| 4,657,487 | A * | 4/1987 | Schonwald et al. | 417/68 |
| 4,776,977 | A | 10/1988 | Taylor | |
| 4,964,732 | A | 10/1990 | Cadeo et al. | |
| 4,971,660 | A | 11/1990 | Rivers, Jr. et al. | |
| 5,157,332 | A | 10/1992 | Reese | |
| 5,407,526 | A | 4/1995 | Danielson et al. | |
| 5,522,660 | A * | 6/1996 | O'Dougherty et al. | 366/136 |
| 5,722,441 | A | 3/1998 | Teramoto | |
| 5,722,442 | A | 3/1998 | Hoffman et al. | |
| 5,755,934 | A | 5/1998 | Hoffman et al. | |
| 5,785,820 | A | 7/1998 | Hoffman et al. | |
| 5,800,056 | A | 9/1998 | Suzuki et al. | |
| 5,846,387 | A | 12/1998 | Hoffman et al. | |
| 5,950,675 | A | 9/1999 | Minami et al. | |
| 5,951,779 | A | 9/1999 | Koyanagi et al. | |
| 5,990,014 | A | 11/1999 | Wilson et al. | |
| 6,120,175 | A | 9/2000 | Tewell | |
| 6,146,008 | A | 11/2000 | Laederich et al. | |
| 6,153,014 | A | 11/2000 | Song | |
| 6,183,720 | B1 | 2/2001 | Laederich et al. | |
| 6,224,778 | B1 | 5/2001 | Peltzer | |
| 6,227,222 | B1 | 5/2001 | Jennings | |
| 6,247,838 | B1 | 6/2001 | Pozniak et al. | |
| 6,286,526 | B1 | 9/2001 | Hase et al. | |
| 6,290,384 | B1 | 9/2001 | Pozniak et al. | |
| 6,464,799 | B1 | 10/2002 | Lerner et al. | |
| 6,584,989 | B2 | 7/2003 | Taft et al. | |
| 6,623,183 | B2 | 9/2003 | Nakagawa et al. | |
| 6,799,883 | B1 | 10/2004 | Urquhart et al. | |
| 6,917,424 | B2 | 7/2005 | Rodrigues et al. | |
| 7,344,297 | B2 | 3/2008 | Urquhart | |
| 2002/0048213 | A1 | 4/2002 | Wilmer et al. | |
| 2002/0124869 | A1 | 9/2002 | Chiu | |
| 2002/0136087 | A1 | 9/2002 | Nakagawa et al. | |
| 2002/0144727 | A1 | 10/2002 | Kashkoush et al. | |
| 2002/0148485 | A1 | 10/2002 | Taft et al. | |
| 2004/0052154 | A1 | 3/2004 | Hiraoka et al. | |
| 2004/0125688 | A1 | 7/2004 | Kelley et al. | |
| 2004/0144164 | A1 | 7/2004 | Bergman | |
| 2005/0084979 | A1 | 4/2005 | Dulphy et al. | |
| 2007/0108113 | A1 * | 5/2007 | Urquhart et al. | 210/198.1 |
| 2007/0119816 | A1 * | 5/2007 | Urquhart et al. | 216/84 |

FOREIGN PATENT DOCUMENTS

| | | |
|---|---|---|
| FR | 2 833 365 | 6/2003 |
| JP | 57 200695 | 12/1982 |
| WO | WO 96 39263 | 12/1996 |
| WO | WO 96 39266 | 12/1996 |
| WO | WO 96 39651 | 12/1996 |
| WO | WO 03 043059 | 5/2003 |
| WO | WO 2006 010121 | 1/2006 |

OTHER PUBLICATIONS

Bannwarth, H., "Fluessigkeitsring-vakuumpumpen und -kompressoren im system," Industriepumpen + Kompressoren, Vulkan Verlag, Essen, Germany, vol. 8, No. 4, Nov. 2002, pp. 192-197.

Danish Examination Report and Written Opinion for corresponding SG 200802195-8.

Austrian Search Report and Written Opinion for related SG 200716910-5.

European Search Report for related EP 00 40 3566.

Int'l Search Report and Written Opinion for related PCT/IB2006/000852.

Int'l Search Report and Written Opinion for related PCT/IB2007/001262.

Int'l Search Report and Written Opinions for related PCT/IB2006/002618 and SG 200802195-8.

Int'l Search Report for related PCT/US95/07649.

Int'l Search Report for related PCT/US96/10389.

Written Opinion for child PCT/IB2007/001250.

Int'l Search Report and Written Opinion for related PCT/IB2007/001267.

* cited by examiner

SYSTEMS AND METHODS FOR MANAGING FLUIDS USING A LIQUID RING PUMP

CROSS-REFERENCE TO RELATED APPLICATIONS

This application claims the benefit under 35 U.S.C. §119(e) to provisional application No. 60/801,913, filed May 19, 2006, the entire contents of which are incorporated herein by reference. This application also claims priority from and is a continuation-in-part of U.S. patent application Ser. No. 11/533,826, filed Sep. 21, 2006, which claims priority from U.S. Provisional Patent Application Ser. No. 60/720,597, entitled "Point of Use Process Control Blender," and filed Sep. 26, 2005. This application is further a continuation-in-part of U.S. patent application Ser. No. 11/107,494, filed Apr. 15, 2005, now U.S. Pat. No. 7,344,297 which is a continuation-in-part of U.S. patent application Ser. No. 10/939,570, filed Sep. 13, 2004, now abandoned which is a divisional application of U.S. patent application Ser. No. 09/468,411, filed Dec. 20, 1999 (now U.S. Pat. No. 6,799,883), which is a continuation-in-part of U.S. patent application Ser. No. 09/051,304, filed Apr. 16, 1998 (now U.S. Pat. No. 6,050,283). The disclosures of the above-identified patent applications are incorporated herein by reference in their entireties.

BACKGROUND

1. Field of the Invention

This disclosure pertains to methods and systems for the management of chemicals in processing environments, such as semiconductor fabrication environments.

2. Related Art

In various industries, chemical delivery systems are used to supply chemicals to processing tools. Illustrative industries include the semiconductor industry, pharmaceutical industry, biomedical industry, food processing industry, household product industry, personal care products industry, petroleum industry and others.

The chemicals being delivered by a given chemical delivery system depend, of course, on the particular processes being performed. Accordingly, the particular chemicals supplied to semiconductor processing tools depend on the processes being performed on wafers in the tools. Illustrative semiconductor processes include etching, cleaning, chemical mechanical polishing (CMP) and wet deposition (e.g., chemical vapor deposition, electroplating, etc.).

Commonly, two or more fluids are combined to form a desired solution for a particular process. The solution mixtures can be prepared off-site and then shipped to an end point location or a point-of-use for a given process. This approach is typically referred to as batch processing or batching. Alternatively, and more desirably, the cleaning solution mixtures are prepared at the point-of-use with a suitable mixer or blender system prior to delivery to the cleaning process. The latter approach is sometimes referred as continuous blending.

In either case, accurate mixing of reagents at desired ratios is particularly important because variations in concentration of the chemicals detrimentally affect process performance. For example, failure to maintain specified concentrations of chemicals for an etch process can introduce uncertainty in etch rates and, hence, is a source of process variation.

In today's processing environments, however, mixing is only one of many aspects that must be controlled to achieve a desired process result. For example, in addition to mixing, it may be desirable or necessary to control removal of chemicals from a processing environment. It may also be desirable or necessary to control temperatures of chemical solutions at various stages in the processing environment. Currently, chemical management systems are not capable of adequately controlling a plurality of process parameters for certain applications.

Therefore, there is a need for methods and systems for managing chemical conditioning and supply in processing environments.

SUMMARY

One embodiment provides a vacuum pump system including a vacuum line fluidly coupled to at least one of a plurality of fluid outlets of a processing station; a liquid ring pump having a suction port coupled to the vacuum line to receive an incoming multiphase stream formed from one or more fluids removed from the plurality of fluid outlets; a tank coupled to an exhaust port of the liquid ring pump and comprising one or more devices configured for removing liquid from a multiphase stream output by the liquid ring pump through the exhaust port; and a pressure control system disposed in the vacuum line upstream from the liquid ring pump, wherein the pressure control system is configured to maintain a target pressure in the vacuum line according to a desired pressure in the processing station.

Another embodiment provides a vacuum pump system including a vacuum line fluidly coupled to at least one of a plurality of fluid outlets of a processing station; a liquid ring pump having a suction port coupled to the vacuum line to receive an incoming multiphase stream formed from one or more fluids removed from the plurality of fluid outlets; a tank coupled to an exhaust port of the liquid ring pump and comprising one or more devices configured for removing liquid from a multiphase stream output by the liquid ring pump through the exhaust port; and a coolant source for injecting a cooling fluid into the incoming multi-phase stream prior to the multiphase stream being input to the liquid ring pump, the cooling fluid having a temperature sufficient to condense liquid from the multiphase stream.

Another embodiment provides a vacuum pump system including a vacuum line fluidly coupled to at least one of a plurality of fluid outlets of a processing station; a liquid ring pump having a suction port coupled to the vacuum line to receive an incoming multiphase stream formed from one or more fluids removed from the plurality of fluid outlets; a tank coupled to an exhaust port of the liquid ring pump and comprising one or more devices configured for removing liquid from a multiphase stream output by the liquid ring pump through the exhaust port; and a chemical concentration control system. The chemical concentration control system is configured to: monitor a concentration of a sealant fluid contained in the tank and fed to the liquid ring pump for the operation of the liquid ring pump; and selectively adjust a concentration of the sealant fluid.

Another embodiment provides a vacuum pump system including a vacuum line fluidly coupled to at least one of a plurality of fluid outlets of a processing station; a liquid ring pump having a suction port coupled to the vacuum line to receive an incoming multiphase stream formed from one or more fluids removed from the plurality of fluid outlets; a tank coupled to an exhaust port of the liquid ring pump and comprising one or more devices configured for removing liquid from a multiphase stream output by the liquid ring pump; a pressure control system disposed in the vacuum line upstream from the liquid ring pump, wherein the pressure control system is configured to maintain a target pressure in the vacuum line according to a desired pressure in the processing station;

and a chemical concentration control system. The chemical concentration control system is configured to: monitor a concentration of a sealant fluid contained in the tank and fed to the liquid ring pump for the operation of the liquid ring pump; and selectively adjust a concentration of the sealant fluid. The system further includes a coolant source for injecting a coolant into the incoming multiphase stream prior to the multiphase stream being input to the liquid ring pump, the coolant having a temperature sufficient to condense liquid from the multiphase stream.

Another embodiment provides a processing system including a chemical blender configured to be selectively and alternately coupled to fluid inlets associated with a first and a second processing station by operation of a flow control unit, so that while the chemical blender is coupled to a first fluid inlet associated with the first processing station the chemical blender is decoupled from a second fluid inlet associated with the second processing station, and vice versa; a plurality of fluid outlets from the processing stations; and a vacuum pump system fluidly coupled to at least one of the plurality of fluid outlets via at least a vacuum line. The vacuum pump system includes a liquid ring pump having a suction port coupled to the vacuum line to receive an incoming multiphase stream formed from one or more fluids removed from the plurality of fluid outlets; and a tank coupled to an exhaust port of the liquid ring pump and comprising one or more devices configured for removing liquid from a multiphase stream output by the liquid ring pump through the exhaust port.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Embodiments of the present invention provide methods and chemical management systems for controlling various aspects of fluid delivery and/or recovery.

systems Overview

Figure 1:
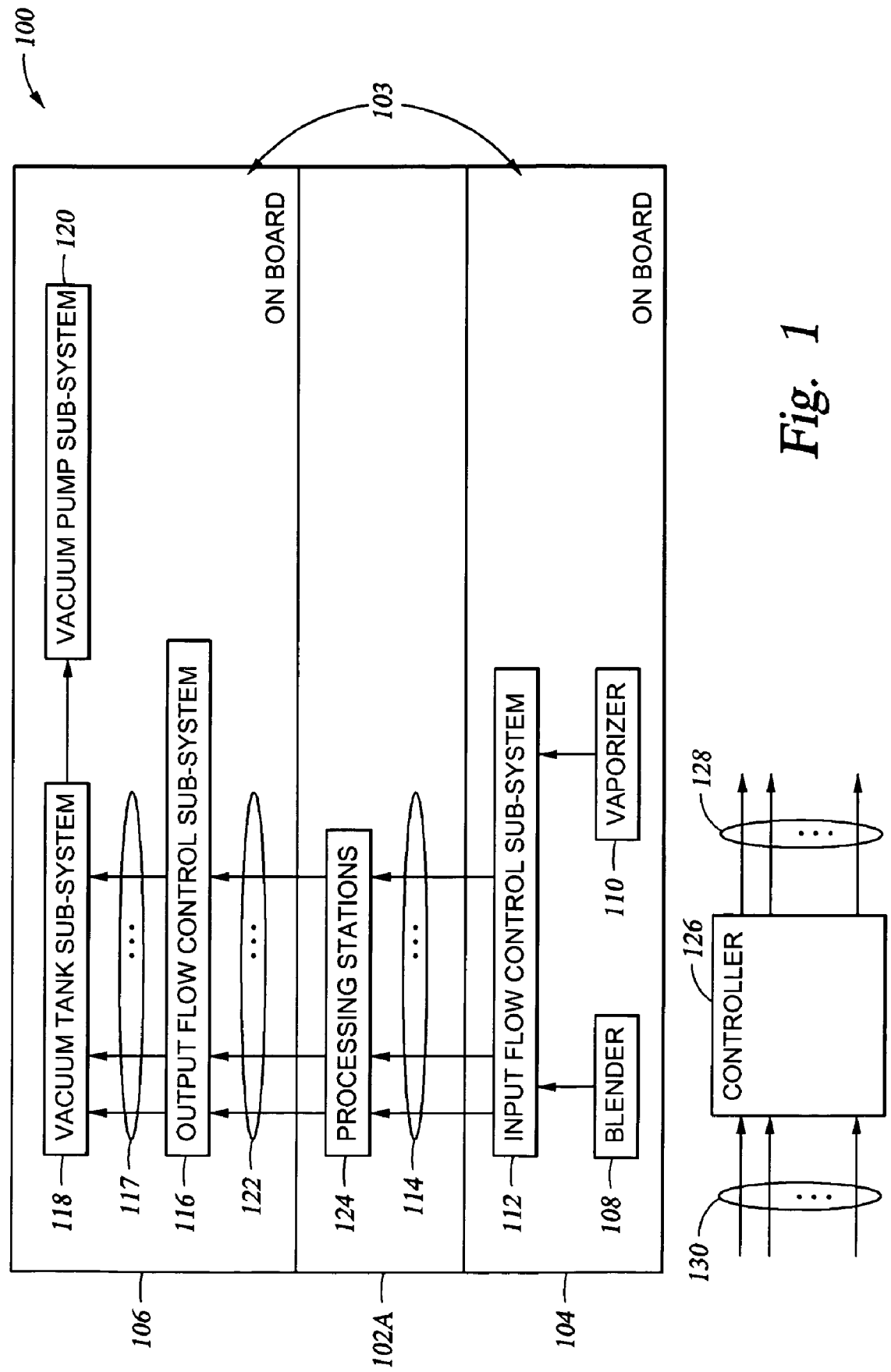
FIG. 1 is a diagram of a processing system illustrating onboard components, according to one embodiment of the present invention.

FIG. 1 shows one embodiment of a processing system 100. Generally, the system 100 includes a processing chamber 102 and a chemical management system 103. According to one embodiment, the chemical management system 103 includes an input subsystem 104 and an output subsystem 106. It is contemplated that any number of the components of the subsystems 104, 106 may be located onboard or off-board, relative to the chamber 102. In this context, "onboard" refers to the subsystem (or component thereof being integrated with the chamber 102 in the Fab (clean room environment), or more generally with a processing tool of which the chamber 102 is a part; while "off-board" refers to the subsystem (or component thereof) being separate from, and located some distance away from, the chamber 102 (or tool, generally). In the case of the system 100 shown in FIG. 1, the subsystems 104, 106 are both onboard, such that the system 100 forms an integrated system which may be completely disposed in a Fab. Accordingly, the chamber 102 and the subsystems 104, 106 may be mounted to a common frame. To facilitate cleaning, maintenance and system modifications the subsystems may be disposed on detachable subframes supported by, for example, casters so that the subsystems may be easily disconnected and rolled away from the chamber 102.

Illustratively, the input subsystem 104 includes a blender 108 and a vaporizer 110 fluidly connected to an input flow control system 112. In general, the blender 108 is configured to mix two or more chemical compounds (fluids) to form a desired chemical solution, which is then provided to the input flow control system 112. The vaporizer 110 is configured to vaporize a fluid and provide the vaporized fluid to the input flow control system 112. For example, the vaporizer 110 may vaporize isopropyl alcohol and then combine the vaporized fluid with a carrier gas, such as nitrogen. The input flow control system 112 is configured to dispense the chemical solution and/or vaporized fluid to the chamber 102 at desired flow rates. To this end, the input flow control system 112 is coupled to the chamber 102A by a plurality of input lines 114. In one embodiment, the chamber 102A is configured with a single processing station 124 at which one or more processes can be performed on a wafer located at the station 124. Accordingly, the plurality of input lines 114 provide the appropriate chemistry (provided by the blender 108 via the input flow control system 112) required for performing a given process at the station 124. In one embodiment, the station 124 may be a bath, i.e., a vessel containing a chemical solution in which a wafer is immersed for a period of time and then removed. However, more generally, the station 124 may be any environment in which one or more surfaces of a wafer are exposed to one or more fluids provided by the plurality of input lines 114. Further, it is understood that while FIG. 1 shows a single processing station, the chamber 102A may include any number of processing stations, as will be described in more detail below with respect to FIG. 2.

Illustratively, the output subsystem 106 includes an output flow control system 116, a vacuum tanks subsystem 118 and a vacuum pumps subsystem 120. A plurality of output lines 122 fluidly couple the chamber 102A to the output flow control system 116. In this way, fluids are removed from the chamber 102A via the plurality of output lines 122. The removed fluids may then be sent to drain, or to the vacuum tanks subsystem 118 via fluid lines 117. In one embodiment, some fluids are removed from the vacuum tanks subsystem 118 and routed to the vacuum pump subsystem 120 for conditioning (e.g., neutralization or dilution) as part of a waste management process.

In one embodiment, the input subsystem 104 and the output subsystem 106 independently or cooperatively effect a plurality of process control objectives. For example, solution concentration may be monitored and controlled at various stages from the blender 108 to the chamber 102A. In another embodiment, the output flow control system 116, the vacuum tanks subsystem 118 and/or the vacuum pumps subsystem 120 cooperate to control a desired fluid flow over a surface of a wafer disposed in the chamber 102A. In another embodiment, the output flow control system 116 and a vacuum pumps subsystem 120 cooperate to condition fluids removed from the chamber 102A by the output flow control system 116 and then return the conditioned fluids to the blender 108. These and other embodiments are described in more detail below.

In one embodiment, transfer means (e.g., robots) are disposed inside and/or proximate the chamber 102A to move wafers into, through and out of the chamber 102. The chamber 102A may also be part of a larger tool, as will be described below.

In one embodiment, the various controllable elements of the system 100 are manipulated by a controller 126. The controller 126 may be any suitable device capable of issuing control signals 128 to one or more controllable elements of the system 100. The controller 126 may also receive a plurality of input signals 130, which may include concentration measurements of solution in the system at different locations, level sensor outputs, temperature sensor outputs, flow meter outputs, etc. Illustratively, the controller 126 may be a microprocessor-based controller for a programmable logic controller (PLC) program to implement various process controls including, in one embodiment, a proportional-integral-derivative (PID) feedback control. An exemplary controller that is suitable for use in the process control blender system is a PLC Simatic S7-300 system commercially available from Siemens Corporation (Georgia). Although the controller 126 is shown as a singular component, it is understood that the controller 126 may in fact be a plurality of control units collectively forming the control system for the processing system 100.

Figure 2:
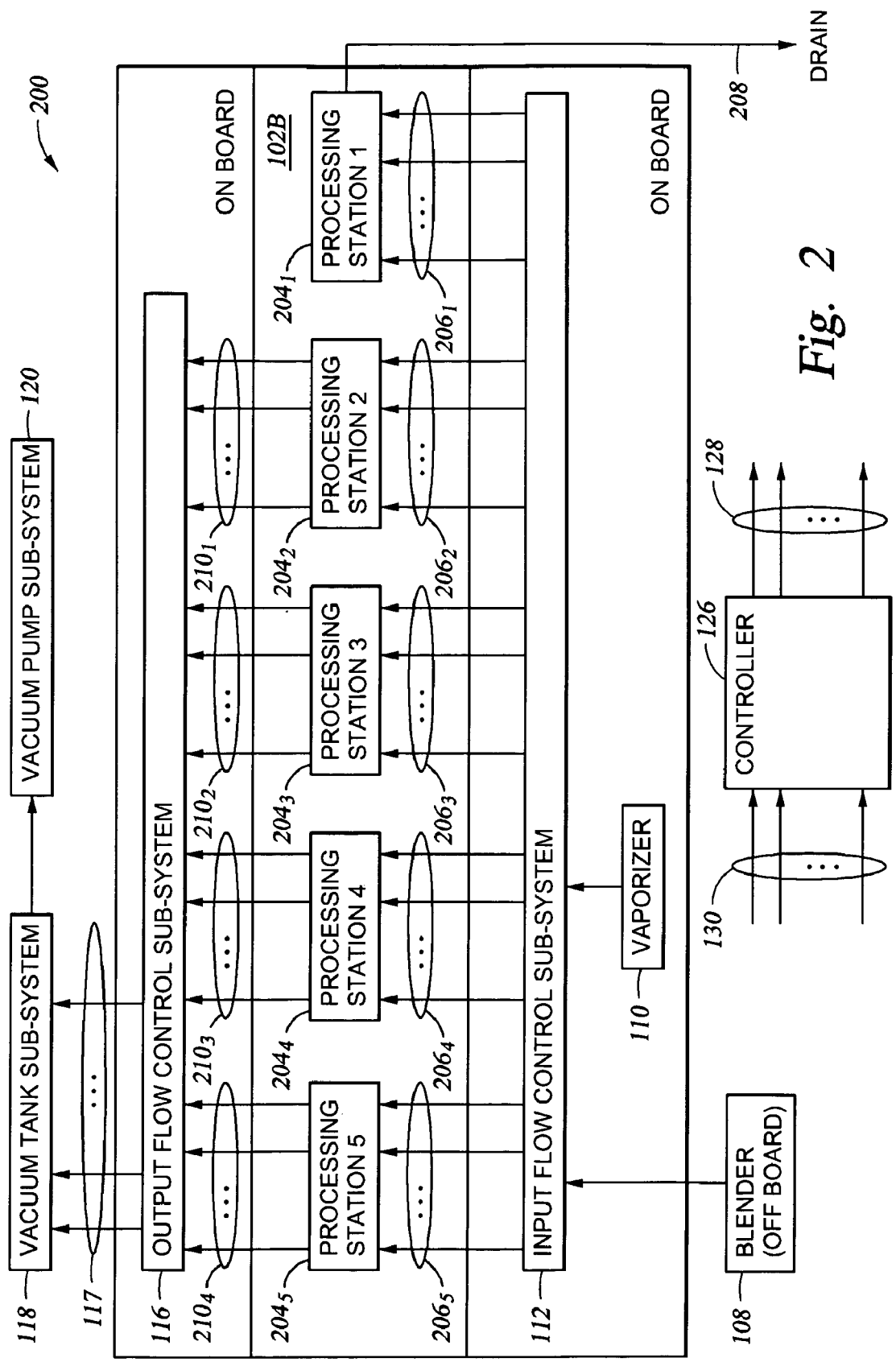
FIG. 2 is a diagram of a processing system illustrating onboard and off-board components, according to another embodiment of the present invention.

As noted above, one or more of the components of the system 100 may be located off-board relative to the chamber 102A (or the overall tool of which the chamber 102A is a part). FIG. 2 shows one such configuration of a processing system 200 having off-board components relative to a chamber 102B. Like numerals refer to components previously described with respect to FIG. 1. Illustratively, the blender 108, the vacuum tanks subsystem 118 and the vacuum pumps subsystem 120 are located off-board. In contrast, the vaporizer 110, the input flow control system 112, and the output flow control system 116 are shown as onboard components, as in FIG. 1. The off-board components may be located in the Fab with the processing tool (i.e., a processing chamber 102B and any other integrated components which may form a processing tool) or in a sub-fab. It should be understood that the configuration of the system 200 in FIG. 2 is merely illustrative and other configurations are possible and contemplated. For example, the system 200 may be configured such that the vacuum tanks subsystem 118 is onboard, while the vacuum pumps subsystem 120 is off-board. Collectively, the blender 108, the vaporizer 110, the input flow control subsystem 112, the output flow control subsystem 116, the vacuum tanks subsystem 118 and a vacuum pumps subsystem 120 make up the chemical management system 103, according to one embodiment of the present invention. It should be noted, however, that the chemical management systems described with respect to FIG. 1 and FIG. 2 are merely illustrative. Other embodiments within the scope of the present invention may include more or less components and/or different arrangements of those components. For example, in one embodiment of the chemical management system the vaporizer 110 is not included.

The system 200 of FIG. 2 also illustrates an embodiment of a multi-station chamber 102B. Accordingly, FIG. 2 shows the processing chamber 102B having five stations $204_{1-5}$ (individually (collectively) referred to as station(s) 204). More generally, however, the chamber 102B may have any number of stations (i.e., one or more stations). In one embodiment, the stations can be isolated from one another by sealing means (e.g., actuatable doors disposed between the processing stations). In a particular embodiment, the isolation means are vacuum tight so that the processing stations may be kept at different pressure levels.

Each station 204 may be configured to perform a particular process on a wafer. The process performed at each station may be different and, therefore, require different chemistry provided by the blender 108 via the input flow control system 112. Accordingly, the system 200 includes a plurality of input line sets $206_{1-5}$, each set corresponding to a different station. In the illustrative embodiment of FIG. 2, five sets $206_{1-5}$ of input lines are shown for each of the five processing stations. Each input line set is configured to provide an appropriate combination of chemicals to a given station. For example, in one embodiment, the chamber 102B is a cleaning module for cleaning wafers before and between, e.g., etching processes. In this case, the input line set $206_1$ for a first processing station $204_1$ may provide a combination of a SC-1 type solution (which includes a mixture of ammonium hydroxide and hydrogen peroxide in deionized water) and deionized water (DIW). The input line set $206_2$ for a second processing station $204_2$ may provide one or more of deionized water (DIW) and isopropyl alcohol (IPA). The input line set $206_3$ for a third processing station $204_3$ may provide one or more of deionized water, diluted hydrogen fluoride, and isopropyl alcohol. The input line set $206_4$ for a fourth processing station $204_4$ may provide one or more of deionized water, known mixed chemical solutions, proprietary chemical solutions of a specific nature and isopropyl alcohol. The input line set $206_5$ for a fifth processing station $204_5$ may provide one or more of deionized water, SC-2 type solution (which includes an aqueous mixture of hydrogen peroxide with hydrochloric acid) and isopropyl alcohol. As in the case of the system 100 described with respect to FIG. 1, the stations 204 may be any environment in which one or more surfaces of a wafer are exposed to one or more fluids provided by the plurality of input lines 114.

It is contemplated that fluid flow through the input lines in a given set 206 (as well as the lines 114 of FIG. 1) may be individually controlled. Accordingly, the timing and a flow rate of fluids through the individual lines of a given set may be independently controlled. Further, while some of the input lines provide fluids to a wafer surface, other fluids may be provided to the internal surfaces of a processing station 204 for the purpose of cleaning the surfaces, e.g., before or after a processing cycle. Further, the input lines shown in FIG. 2 are merely illustrative and other inputs may be provided from other sources.

Each of the processing stations $204_{1-5}$ has a corresponding output line or set of output lines, whereby fluids are removed from the respective processing stations. Illustratively, the first processing stations $204_1$ is coupled to a drain 208, while the second through the fourth processing stations $204_{2-4}$ are shown coupled to the output flow control system 116 via respective output line sets $210_{1-4}$. Each set is representative of one or more output lines. In this way, fluids are removed from the chamber 102A via the plurality of output lines 122. The fluids removed from the processing stations via the output line sets $210_{1-4}$ coupled to the output flow control system 116 may be routed to the vacuum tanks subsystem 118 via a plurality of fluid lines 117.

In one embodiment, transfer means (e.g., robots) are disposed inside and/or proximate the chamber 102B to move wafers into, through, and out of the chamber 102B. The chamber 102B may also be part of a larger tool, as will now be described below with respect to FIG. 3.

Figure 3:
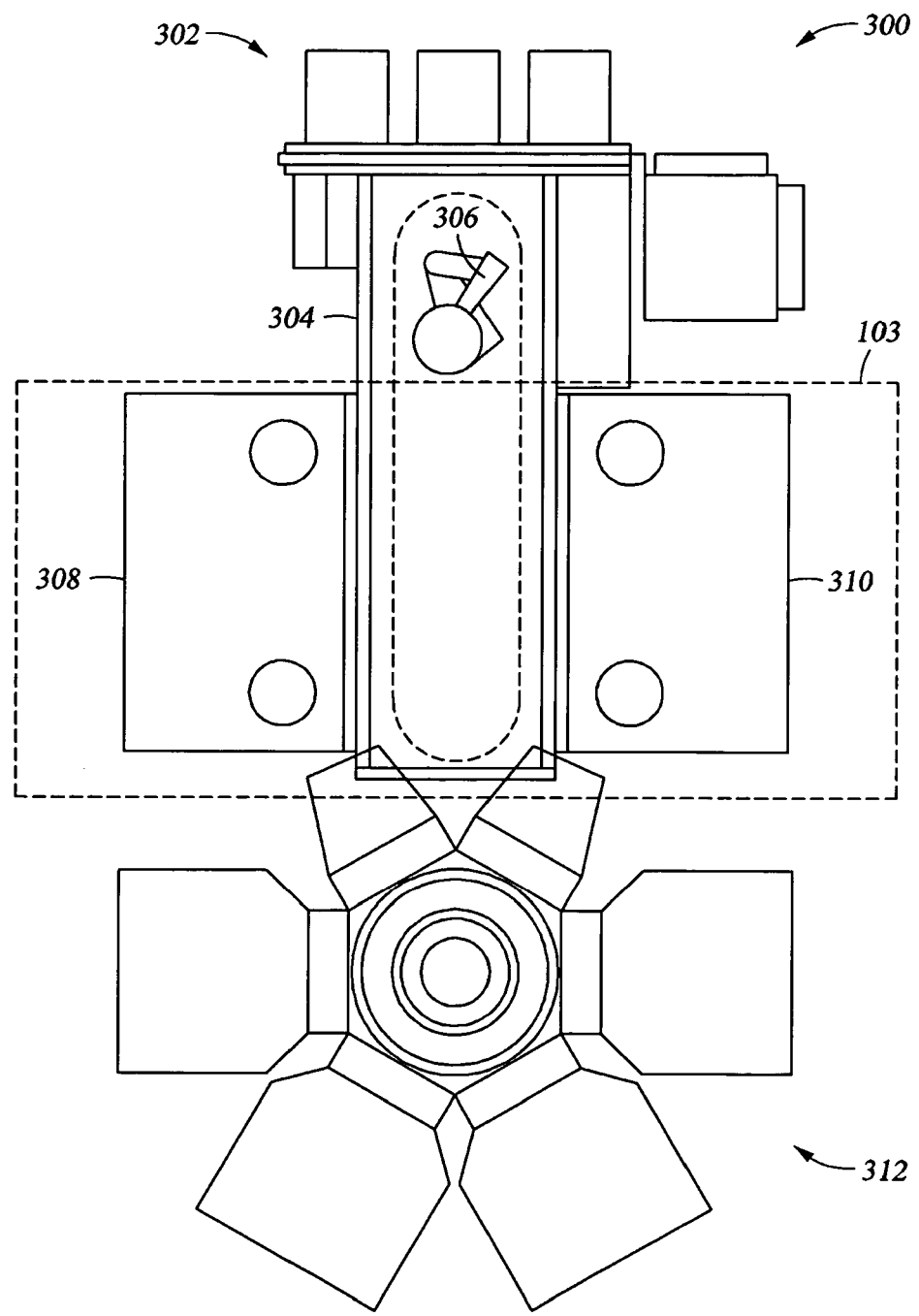
FIG. 3 is a diagram of a semiconductor fabrication system, according to one embodiment of the present invention.

Referring now to FIG. 3, a plan view of a processing system 300 is shown, according to one embodiment of the present invention. The processing system 300 includes a front end section 302 for receiving wafer cassettes. The front end section 302 interfaces with a transfer chamber 304 housing a transfer robot 306. Cleaning modules 308, 310 are disposed on either side of the transfer chamber 304. The cleaning modules 308, 310 may each include a processing chamber (single station or multi-station), such as those cleaning chambers 102A-B described above with respect to FIG. 1 and FIG. 2. The cleaning modules 308, 310 include and/or are coupled to the various components of the chemical management system 103 described above. (The chemical management system 103 is shown in dashed lines to represent the fact that some components of the chemical management system may be located onboard the processing system 300 and other components may be located off-board; or all components can be located onboard.) Opposite the front end section 302, the transfer chamber 304 is coupled to a processing tool 312.

In one embodiment, the front and section 302 may include load lock chambers which can be brought to a suitably low transfer pressure and then opened to the transfer chamber 304. The transfer robot 306 then withdraws individual wafers from the wafer cassettes located in the load lock chambers and transfers the wafers either to the processing tool 312 or to one of the cleaning modules 308, 310. During operation of the system 300, the chemical management system 103 controls the supply and removal of fluids to/from the cleaning modules 308, 310.

It is understood that the system 300 is merely one embodiment of a processing system having the chemical management system of the present invention. Accordingly, embodiments of the chemical management system are not limited to configurations such as that shown in FIG. 3, or even to semiconductor fabrication environments.

Systems and Process Control

Figure 4A:
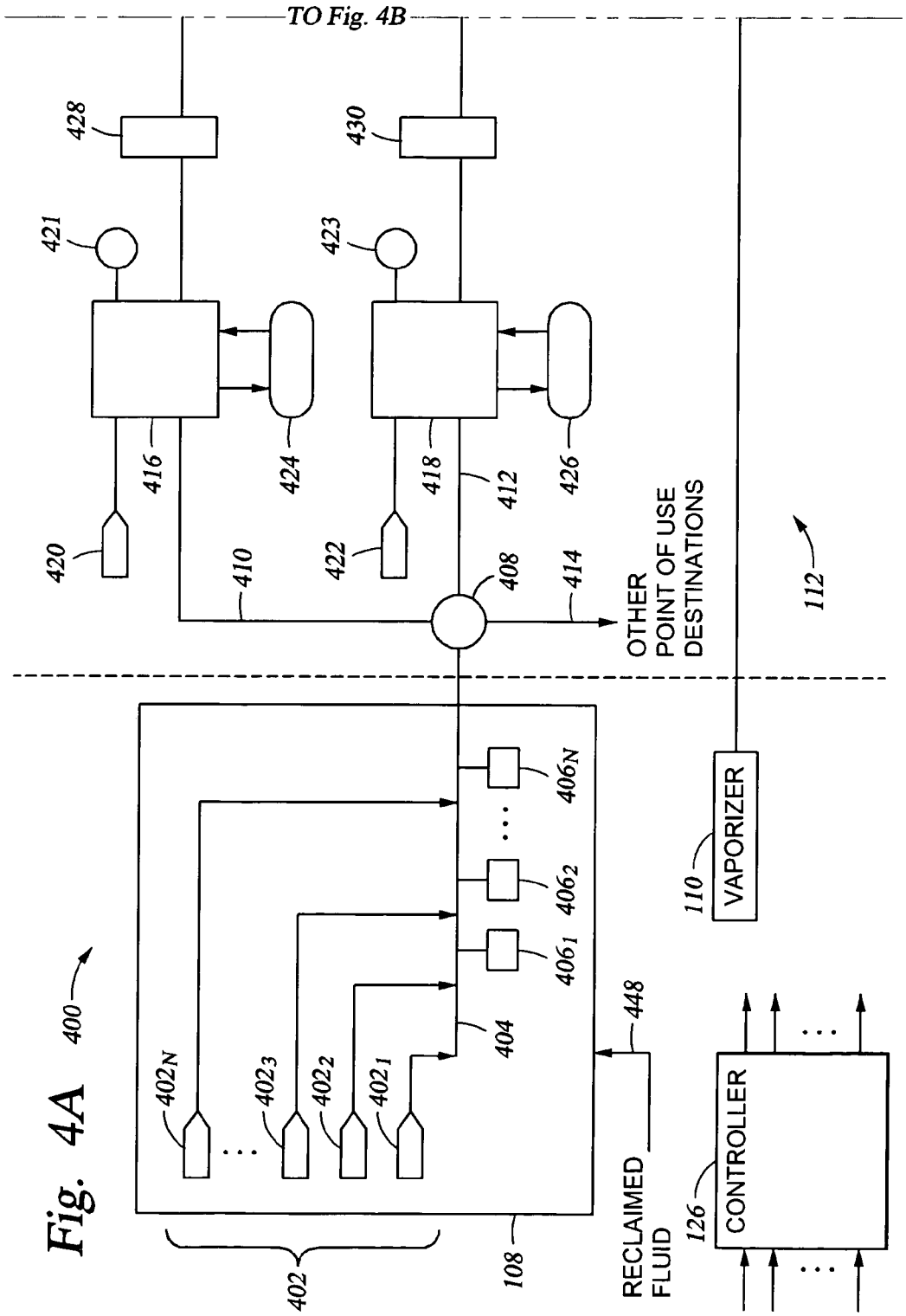
FIGS. 4A and 4B are diagrams of a processing system, according to one embodiment of the present invention.
Figure 4B:
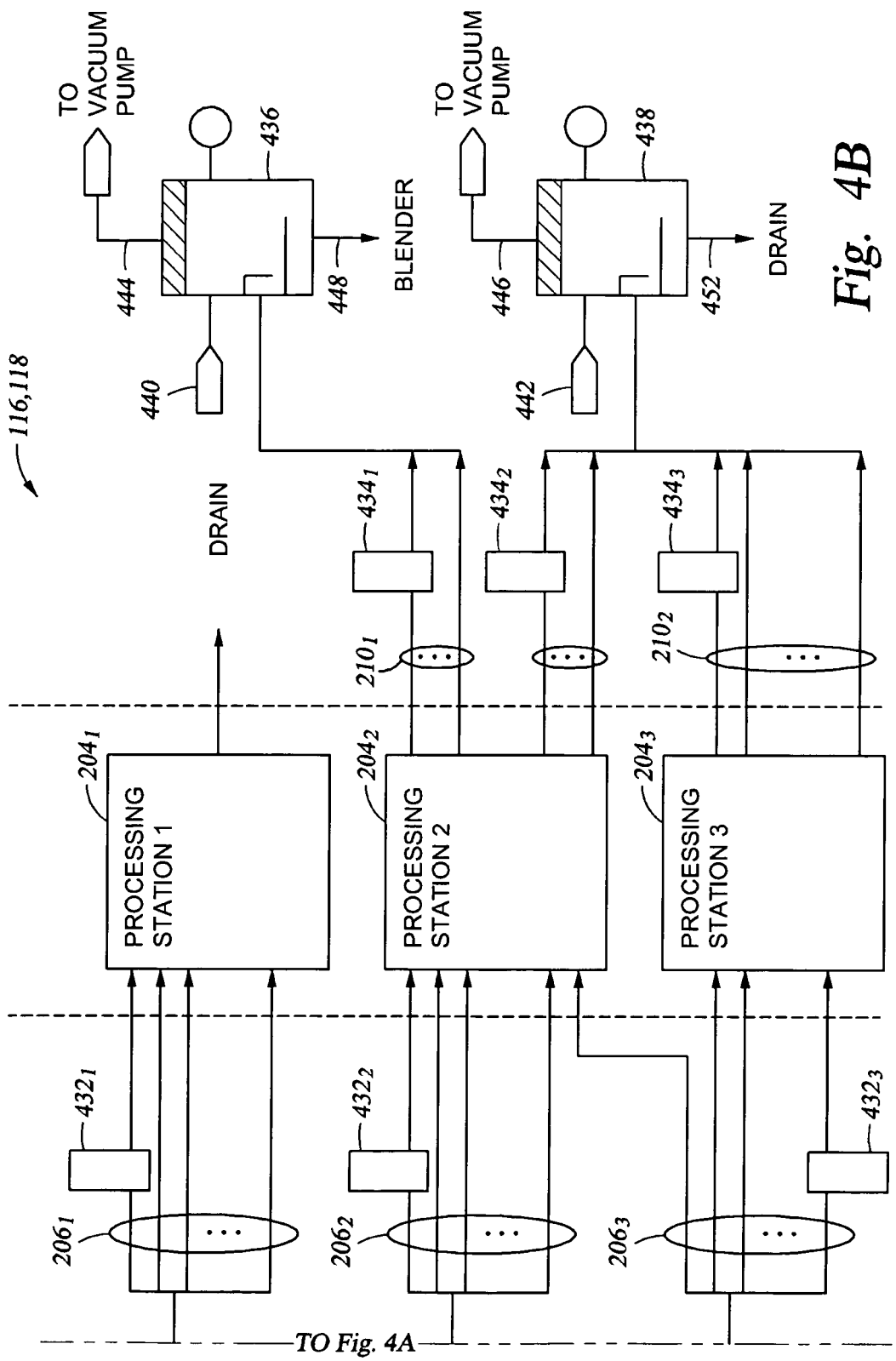

Referring now to FIG. 4, a processing system 400 is shown with respect to which additional embodiments of a chemical management system will now be described. For convenience, the additional embodiments will be described with respect to a multi-station chamber system, such as the system 200 shown in FIG. 2 and described above. It is understood, however, that the following embodiments also apply to the system 100 shown in FIG. 1. Further, it is noted that the order of the processing stations 204 in FIG. 4 is not necessarily reflective of the order in which processing is performed on a given wafer, but rather is arranged for convenience of illustration. For convenience, like reference numbers correspond to like components previously described with respect to FIGS. 1 and/or 2 and will not be described in detail again.

The blender 108 of the system 400 is configured with a plurality of inputs $402_{1-N}$ (collectively inputs 402) each receiving a respective chemical. The inputs 402 are fluidly coupled to a primary supply line 404, wherein the respective chemicals are mixed to form a solution. In one embodiment, the concentrations of the various chemicals are monitored at one or more stages along the supply line 404. Accordingly, FIG. 4 shows a plurality of chemical monitors $406_{1-3}$ (three shown by way of illustration) disposed in-line along the supply line 404. In one embodiment, a chemical monitor is provided at each point in the supply line 404 where two or more chemicals are combined and mixed. For example, a first chemical monitor $406_1$ is disposed between a point where the first and second chemicals (inputs $402_{1-2}$) are mixed and a point (i.e., upstream from) where a third chemical (input $402_3$) is introduced into the supply line 404. In one embodiment, the concentration monitors 406 used in the system are electrode-less conductivity probes and/or Refraction Index (RI) detectors including, without limitation, AC toroidal coil sensors such as the types commercially available under the model 3700 series from GLI International, Inc. (Colorado), RI detectors such as the types commercially available under the model CR-288 from Swagelok Company (Ohio), and acoustic signature sensors such as the types commercially available from Mesa Laboratories, Inc. (Colorado).

The blender 108 is selectively fluidly coupled via the primary supply line 404 to a plurality of point of use destinations (i.e., processing stations 204). (Of course, it is contemplated that in another embodiment the blender 108 services only one point of use destination.) In one embodiment, the selectivity of which processing station to service is controlled by a flow control unit 408. The flow control unit 408 is representative of any number of devices suitable for controlling aspects of fluid flow between the blender and downstream destinations. For example, the flow control unit 408 may include a multi-way valve for controlling the routing of the solution from the blender 108 to a downstream destination. Illustratively, the flow control unit 408 can selectively (e.g., under the control of the controller 126) route the solution from the blender 108 to a first point of use supply line 410, a second point of use supply line 412 or a third point of use supply line 414, where each point of use supply line is associated with a different processing station. The flow control unit 408 may also include flow meters or flow controllers.

In one embodiment, a vessel is disposed in-line with respect to each of the point of use supply lines. For example, FIG. 4 shows a first vessel 416 fluidly coupled to the first point of use supply line 410, between the flow control unit 408 and the first processing station $204_1$. Similarly, a second vessel 418 is fluidly coupled to the second point of use supply line 412, between the flow control unit 408 and the second processing station $204_2$. The vessels are suitably sized to provide a sufficient volume for supplying the respective processing stations during a time when the blender 108 is servicing a different processing station (or when the blender 108 is otherwise unavailable, such as for maintenance). In a particular embodiment, the vessels have a capacity of 6 to 10 liters, or specific volumes required for given processing requirements. The fluids levels of each vessel may be determined by the provision of respective level sensors 421, 423 (e.g., high and low sensors). In one embodiment, the vessels 416, 418 are pressure vessels and, accordingly, each include a respective inlet 420, 422 for receiving a pressurizing gas. In one embodiment, the contents of the vessels 416, 418 are monitored for concentration. Accordingly, the vessels 416, 418 shown in FIG. 4 include active concentration monitoring systems 424, 426. These and other aspects of the system 400 will be described in more detail below with respect to FIGS. 5-6.

In operation, the vessels 416, 418 dispense their contents by manipulating respective flow control devices 428, 430. The flow control devices 428, 430 may be, for example, pneumatic valves under the control of the controller 126. The solution dispensed by the vessels 416, 418 is then flowed to the respective processing station 204 via the respective input lines 206. Further, the vaporized fluid from the vaporizer 110 may be flowed to one or more processing station 204. For example, in the present illustration, vaporized fluid is input to the second processing station $204_2$.

Each of the individual input lines 206 may have one or more fluid management devices $432_{1-3}$ (for convenience, each set of input lines is shown having only one associated fluid management device). The fluid management devices 432 may include, for example, filters, flow controllers, flow meters, valves, etc. In a particular embodiment, one or more of the flow management devices 432 include heaters for heating the fluids being flowed through the respective lines.

Removal of fluids from the respective processing chambers is then performed by operation of the output flow control subsystem 116. As shown in FIG. 4, each of the respective plurality of output lines 210 of the output flow control subsystem 116 includes its own associated one or more flow management devices $434_{1-3}$ (for convenience, each set of output lines is shown having only one associated fluid management device). The fluid management devices 434 may include, for example, filters, flow controllers, flow meters, valves, etc. In one embodiment, the fluid management devices may include active pressure control units. For example, a pressure control unit may be made up of a pressure transducer coupled to a flow controller. Such active pressure control units may operate to effect a desired process control with respect to wafers and the respective processing stations, such as by controlling the interface of fluid and a wafer surface. For example, it may be necessary to control the pressure in the output lines relative to the pressure and the processing stations to ensure a desired fluid/wafer interface.

In one embodiment, fluids removed by the output flow control subsystem 116 are flowed into one or more vacuum tanks of the vacuum tanks subsystem 118. Accordingly, by way of illustration, the system 400 includes two vacuum tanks. A first tank 436 is coupled to the output lines $210_1$ of the second processing chamber $204_2$. A second tank 438 is coupled to the output lines $210_3$ of the third processing chamber $204_3$. In one embodiment, a separate tank may be provided for each different chemistry input to the respective processing stations. Such an arrangement may facilitate reuse of the fluids (reclamation will be described in more detail below) or disposal of the fluids.

The fluid levels in each of the tanks 436, 438 may be monitored by one or more level sensors 437, 439 (e.g., high and low level sensors). In one embodiment, the tanks 436, 438 are selectively pressurized by the input of a pressurizing gas 440, 442 and may also be vented to depressurize the tanks. Further, each tank 436, 438 is coupled to the vacuum pump subsystem 120 by a respective vacuum line 444, 446. In this way, vapors can be removed from the respective tanks and processed at the vacuum pump subsystem 120, as will be described in more detail below. In general, the contents of the tanks may either be sent to drain or be reclaimed and returned to the blender for reuse. Accordingly, the second tank 438 is shown emptying to a drain line 452. In contrast, the first tank 436 is shown coupled to a reclamation line 448. The reclamation line 448 is fluidly coupled to the blender 108. In this way, fluids may be returned to the blender 108 from the processing station(s) and reused. The reclamation of fluids will be described in more detail below with respect to FIG. 8.

In one embodiment, fluid delivery in the system 400 is facilitated by establishing a pressure gradient. For example, with respect to the system 400 shown in FIG. 4, a decreasing pressure gradient may be established beginning with the blender 108 and ending with the processing stations 204. In one embodiment, the blender 108 and vaporizer 110 are operated at a pressure of about 2 atmospheres, the input flow control subsystem 112 is operated at about 1 atmosphere and the processing stations 204 are operated at about 400 Torr. Establishing such a pressure gradient motivates fluid flow from the blender 108 to the processing stations 204.

During operation, the vessels 416, 418 will become depleted and must be periodically refilled. According to embodiment, the management (e.g., filling, dispensation, repair and/or maintenance) of the individual vessels occurs asynchronously. That is, while a given vessel is being serviced (e.g., filled), the other vessels may continue to dispense solution. A filling cycle for a given vessel may be initiated in response to a signal from a low fluid level sensor (one or the sensors 420, 423). For example, assume that the sensor 421 of the first vessel 416 indicates a low fluid level to the controller 126. In response, the controller 126 causes the first vessel 416 to depressurize (e.g. by opening a vent) and causes the flow control unit 408 to place the first vessel 416 in fluid communication with the blender 108, while isolating the blender from the other vessels. The controller 126 then signals the blender 108 to mix and dispense the appropriate solution to the first vessel 416. Once the first vessel 416 is sufficiently filled (e.g., as indicated by a high-level fluid sensor), the controller 126 signals the blender 108 to stop dispensing solution and causes the flow control unit 408 to isolate the blender 108 from the first vessel 416. Further, the first vessel 416 may then be pressurized by injecting a pressurizing gas into the gas inlet 420. The first vessel 416 is now ready to begin dispensation of solution to the first processing station. During this filling cycle, each of the other vessels may continue to dispense solution to their respective processing stations.

In one embodiment, it is contemplated that servicing the respective vessels is based on a prioritization algorithm implemented by the comptroller 126. For example, the prioritization algorithm may be based on volume usage. That is, the vessel dispensing the highest volume (e.g., in a given period of time) is given highest priority, while the vessel dispensing the lowest volume is given lowest priority. In this way, the prioritization of the vessels can be ranked from highest volume dispensed to lowest volume dispensed.

Blenders

In various embodiments, the present invention provides a point-of-use process control blender system which includes at least one blender to receive and blend at least two chemical compounds together for delivery to one or more vessels or tanks including chemical baths that facilitate processing (e.g., cleaning) of semiconductor wafers or other components. The chemical solution is maintained at a selected volume and temperature within the tank or tanks, and the blender can be configured to continuously deliver chemical solution to one or more tanks or, alternatively, deliver chemical solution to the one or more tanks only as necessary (as mentioned above and described further below), so as to maintain concentrations of compounds within the tank(s) within desirable ranges.

The tank can be part of a process tool, such that the blender provides chemical solution directly to a process tool that includes a selected volume of a chemical bath. The process tool can be any conventional or other suitable tool that processes a semiconductor wafer or other component (e.g., via an etching process, a cleaning process, etc.), such as the tool 312 described above with respect to FIG. 3. Alternatively, the blender can provide chemical solution to one or more holding or storage tanks, where the storage tank or tanks then provide the chemical solution to one or more process tools.

In one embodiment, a point-of-use process control blender system is provided that is configured to increase the flow rate of chemical solution to one or more tanks when the concentration of one or more compounds within the solution falls outside of a selected target range, so as to rapidly displace undesirable chemical solution(s) from the tank(s) while supplying fresh chemical solution to the tank(s) at the desired compound concentrations.

Figure 5:
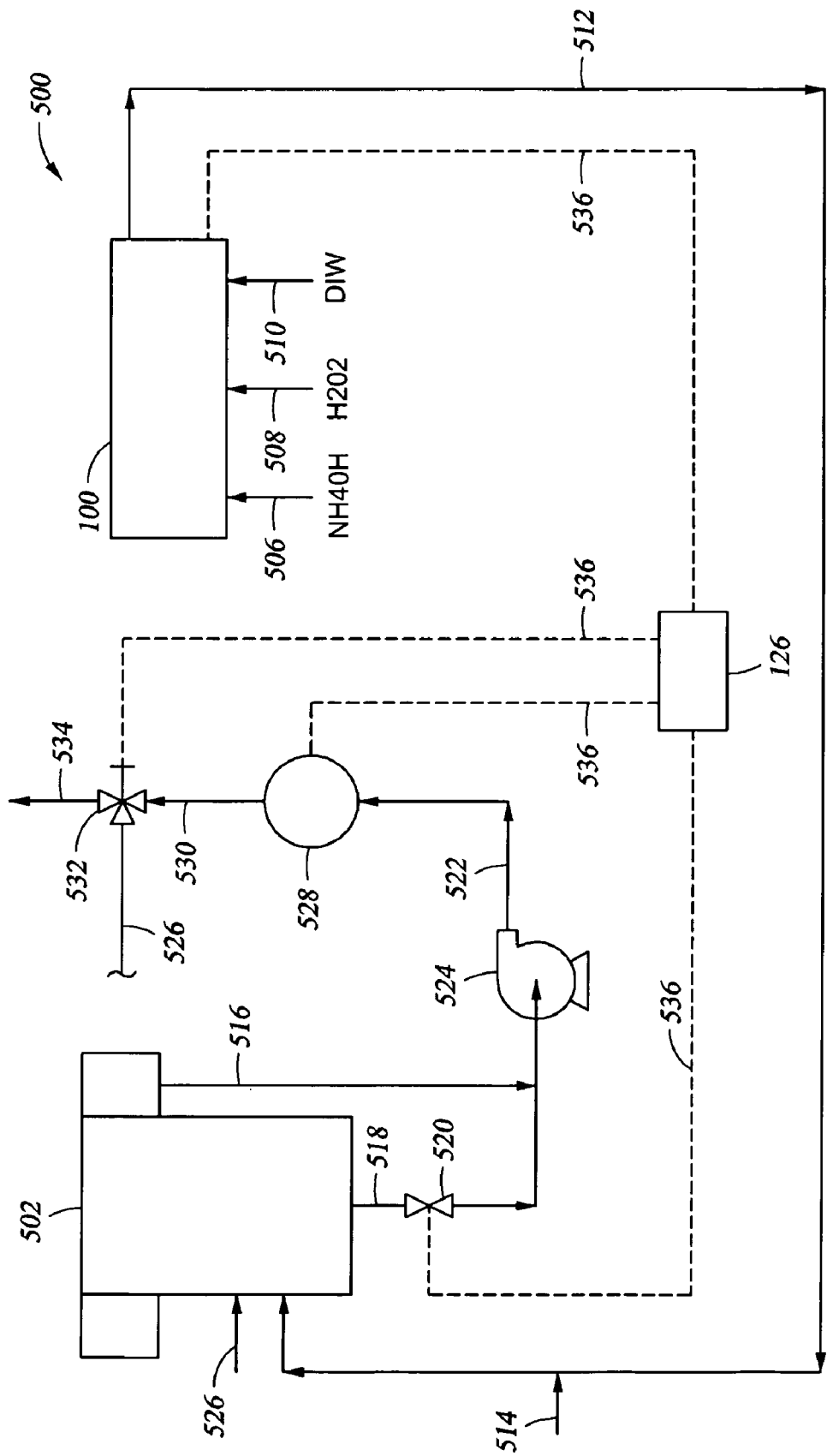
FIG. 5 is a schematic diagram of an exemplary embodiment of a semiconductor wafer cleaning system including a cleaning bath connected with a point-of-use process control blender system that prepares and delivers a cleaning solution to the cleaning bath during a cleaning process.

Referring now to FIG. 5, a blender system 500 including the blender 108 is shown, according to one embodiment of the invention. The blender 108 is shown coupled to a tank 502, and in combination with monitoring and recirculation capabilities, according to one embodiment. In one embodiment, the tank 502 is the pressure vessel 416 or 418 shown in FIG. 4. Alternatively, the tank 502 is a cleaning tank (e.g., in one of the cleaning modules 308, 310 of the processing system 400) in which semiconductor wafers or other components are immersed and cleaned.

An inlet of cleaning tank 502 is connected with the blender 108 via a flow line 512. The flow line 512 may correspond to one of the point of use lines 410, 412, 414 shown in FIG. 4, according to one embodiment. In the illustrative embodiment, the cleaning solution formed in the blender unit 108 and provided to cleaning tank 502 is an SC-1 cleaning solution, with ammonium hydroxide ($NH_4OH$) being provided to the blender unit via a supply line 506, hydrogen peroxide ($H_2O_2$) being provided to the blender unit via a supply line 508, and de-ionized water (DIW) being provided to the blender unit via a supply line 510. However, it is noted that the blender system 500 can be configured to provide a mixture of any selected number (i.e., two or more) of chemical compounds at selected concentrations to any type of tool, where the mixtures can include chemical compounds such as hydrofluoric acid (HF), ammonium fluoride ($NH_4F$), hydrochloric acid (HCl), sulfuric acid ($H_2SO_4$), acetic acid ($CH_3OOH$), ammonium hydroxide ($NH_4OH$), potassium hydroxide (KOH), ethylene diamine (EDA), hydrogen peroxide ($H_2O_2$), and nitric acid ($HNO_3$). For example, the blender 108 may be configured to dispense solutions of dilute HF, SC-1, and/or SC-2. In a particular embodiment, it may be desirable to input hot diluted HF. Accordingly, the blender 108 may be configured with an input for hot DIW. In a particular embodiment, the hot DIW may be maintained from about 25° C. to about 70° C.

In addition, any suitable surfactants and/or other chemical additives (e.g., ammonium peroxysulfate or APS) can be combined with the cleaning solutions to enhance the cleaning effect for a particular application. A flow line 514 is optionally connected with flow line 512 between the blender unit 108 and the inlet to tank 502 to facilitate the addition of such additives to the cleaning solution for use in the cleaning bath.

Tank 502 is suitably dimensioned and configured to retain a selected volume of cleaning solution within the tank (e.g., a sufficient volume to form the cleaning bath for cleaning operations). As noted above, the cleaning solution can be continuously provided from blender unit 108 to tank 502 at one or more selected flow rates. Alternatively, cleaning solution can be provided from the blender unit to the tank only at selected time periods (e.g., at initial filling of the tank, and when one or more components in the cleaning solution within the tank falls outside of a selected or target concentration range). Tank 502 is further configured with an overflow section and outlet that permits cleaning solution to exit the tank via overflow line 516 while maintaining the selected cleaning solution volume within the tank as cleaning solution is continuously fed and/or recirculated to the tank in the manner described below.

The tank is also provided with a drain outlet connected with a drain line 518, where the drain line 518 includes a valve 520 that is selectively controlled to facilitate draining and removal of cleaning solution at a faster rate from the tank during selected periods as described below. Drain valve 520 is preferably an electronic valve that is automatically controlled by a controller 126 (previously described above with respect to FIGS. 1-4). The overflow and drain lines 516 and 518 are connected to a flow line 522 including a pump 524 disposed therein to facilitate delivery of the cleaning solution removed from tank 502 to a recirculation line 526 and/or a collection site or further processing site as described below.

A concentration monitor unit 528 is disposed in flow line 522 at a location downstream from pump 524. The concentration monitor unit 528 includes at least one sensor configured to measure the concentration of one or more chemical compounds in the cleaning solution (e.g., $H_2O_2$ and/or $NH_4OH$) as the cleaning solution flows through line 522. The sensor or sensors of concentration monitor unit 528 can be of any suitable types to facilitate accurate concentration measurements of one or more chemical compounds of interest in the cleaning solution. In some embodiments, the concentration sensors used in the system are electrode-less conductivity probes and/or Refraction Index (RI) detectors including, without limitation, AC toroidal coil sensors such as the types commercially available under the model 3700 series from GLI International, Inc. (Colorado), RI detectors such as the types commercially available under the model CR-288 from Swagelok Company (Ohio), and acoustic signature sensors such as the types commercially available from Mesa Laboratories, Inc. (Colorado).

A flow line 530 connects an outlet of concentration monitor unit 528 with an inlet of a three-way valve 532. The three-way valve may be an electronic valve that is automatically controlled by controller 126 in the manner described below based upon concentration measurements provided by unit 528. A recirculation line 526 connects with an outlet of valve 532 and extends to an inlet of tank 502 to facilitate recirculation of solution from the overflow line 516 back to the tank during normal system operation (as described below). A drain line 534 extends from another outlet of valve 532 to facilitate removal of solution from tank 502 (via line 516 and/or line 522) when one or more component concentrations within the solution are outside of the target ranges.

Recirculation flow line 526 can include any suitable number and types of temperature, pressure and/or flow rate sensors and also one or more suitable heat exchangers to facilitate heating, temperature and flow rate control of the solution as it recirculates back to the tank 502. The recirculation line is useful for controlling the solution bath temperature within the tank during system operation. In addition, any suitable number of filters and/or pumps (e.g., in addition to pump 524) can be provided along flow line 526 to facilitate filtering and flow rate control of the solution being recirculated back to tank 502. In one embodiment, the recirculation loop defined by the drain line 518, the valve 520, the pump 524, the line 522, the concentration monitor unit 528, the 3-way valve 532 and the recirculation line 526 defines the one of the concentration monitoring systems 424, 426 described above with reference to FIG. 4.

The blender system 500 includes a controller 126 that automatically controls components of the blender unit 108 as well as drain valve 520 based upon concentration measurements obtained by concentration monitor unit 528. As described below, the controller controls the flow rate of cleaning solution from blender unit 108 and draining or withdrawal of cleaning solution from tank 502 depending upon the concentration of one or more compounds in the cleaning solution exiting tank 502 as measured by concentration monitor unit 528.

Controller 126 is disposed in communication (as indicated by dashed lines 536 in FIG. 5) with drain valve 520, concentration monitor unit 528, and valve 532, as well as certain components of blender unit 108 via any suitable electrical wiring or wireless communication link to facilitate control of the blender unit and drain valve based upon measured data received from the concentration monitor unit. The controller can include a processor that is programmable to implement any one or more suitable types of process control, such as proportional-integral-derivative (PID) feedback control. An exemplary controller that is suitable for use in the process control blender system is a PLC Simatic S7-300 system commercially available from Siemens Corporation (Georgia).

As noted above, the blender unit 108 receives independently fed streams of ammonium hydroxide, hydrogen peroxide and de-ionized water (DIW), which are mixed with each other at suitable concentrations and flow rates so as to obtain an SC-1 cleaning solution having a desired concentration of these compounds. The controller 126 controls the flow of each of these compounds within blender unit 108 to achieve the desired final concentration and further controls the flow rate of SC-1 cleaning solution to form the cleaning bath in tank 502.

Figure 6:
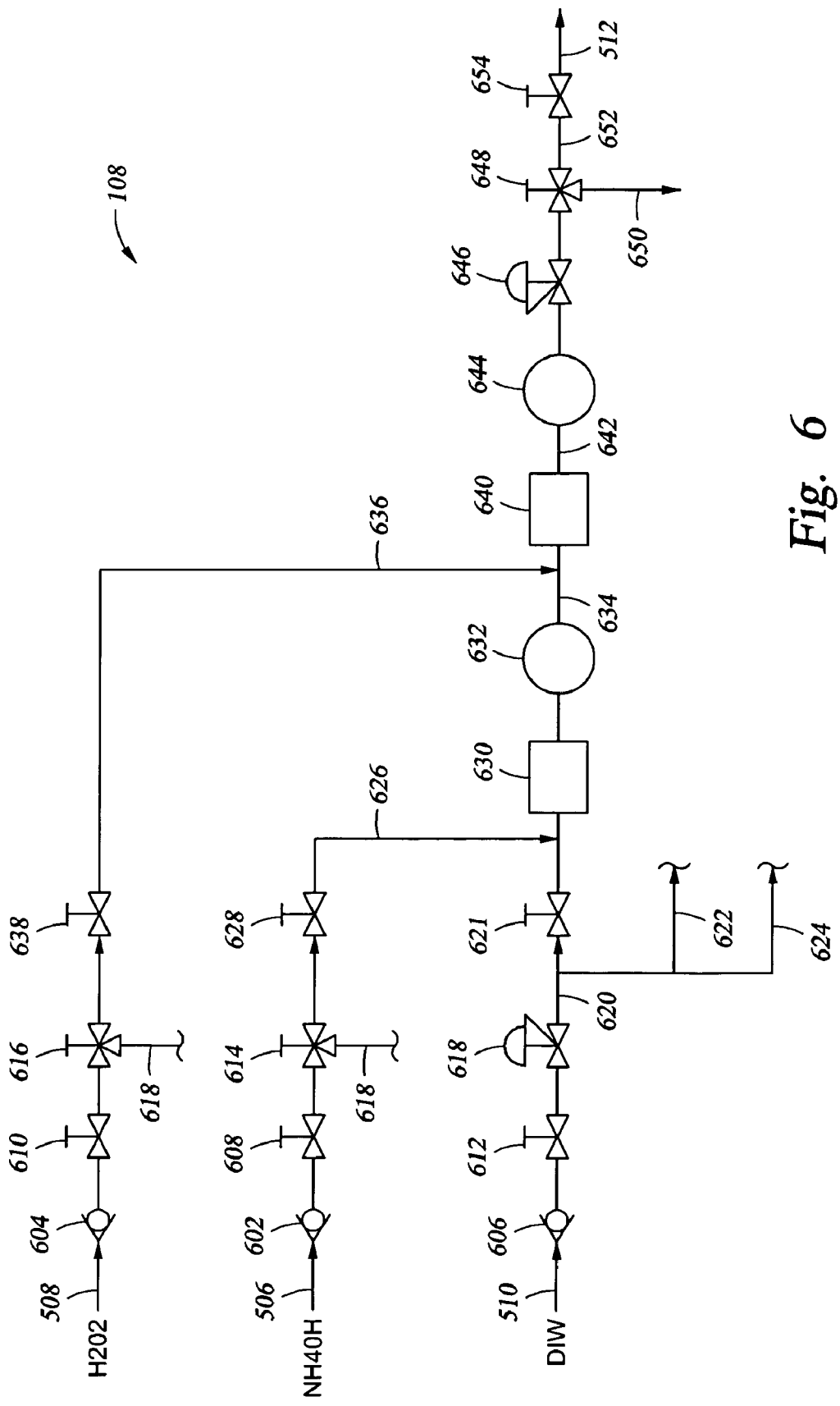
FIG. 6 is a schematic diagram of an exemplary embodiment of the process control blender system of FIG. 5.

An exemplary embodiment of the blender unit is depicted in FIG. 6. In particular, each of the supply lines 506, 508 and 510 for supplying $NH_4OH$, $H_2O_2$ and DIW to blender unit 108 includes a check valve 602, 604, 606 and an electronic valve 608, 610, 612 disposed downstream from the check valve. The electronic valve for each supply line is in communication with controller 126 (e.g., via electronic wiring or wireless link) to facilitate automatic control of the electronic valves by the controller during system operation. Each of the $NH_4OH$ and $H_2O_2$ supply lines 506 and 508 respectively connects with an electronic three-way valve 614, 616 that is in communication with controller 126 (via electronic wiring or a wireless link) and is disposed downstream from the first electronic valve 608, 610.

The DIW supply line 510 includes a pressure regulator 618 disposed downstream from electronic valve 612 to control the pressure and flow of DIW into system 108, and line 510 further branches into three flow lines downstream from regulator 618. A first branched line 620 extending from main line 510 includes a flow control valve 621 disposed along the branched line and which is optionally controlled by controller 126, and line 620 further connects with a first static mixer 630. A second branched line 622 extends from main line 510 to an inlet of the three-way valve 614 that is also connected with $NH_4OH$ flow line 506. In addition, a third branched line 624 extends from main line 510 to an inlet of the three-way valve 616 which is also connected with $H_2O_2$ flow line 508. Thus, the three-way valves for each of the $NH_4OH$ and $H_2O_2$ flow lines facilitate the addition of DIW to each of these flows to selectively adjust the concentration of ammonium hydroxide and hydrogen peroxide in distilled water during system operation and prior to mixing with each other in the static mixers of the blender unit.

An $NH_4OH$ flow line 626 is connected between an outlet of the three-way valve 614 for the ammonium hydroxide supply line and the first branch line 620 of the de-ionized water supply line at a location between valve 621 and static mixer 630. Optionally, flow line 626 can include a flow control valve 628 that can be automatically controlled by controller 126 to enhance flow control of ammonium hydroxide fed to the first static mixer. The ammonium hydroxide and de-ionized water fed to the first static mixer 630 are combined in the mixer to obtain a mixed and generally uniform solution. A flow line 634 connects with an outlet of the first static mixture and extends to and connects with a second static mixer 640. Disposed along flow line 634 is any one or more suitable concentration sensors 632 (e.g., one or more electrode-less sensors or RI detectors of any of the types described above) that determines the concentration of ammonium hydroxide in the solution. Concentration sensor 632 is in communication with controller 126 so as to provide the measured concentration of ammonium hydroxide in the solution emerging from the first static mixer. This in turn facilitates control of the concentration of ammonium hydroxide in this solution prior to delivery to the second static mixer 640 by selective and automatic manipulation of any of the valves in one or both of the $NH_4OH$ and DIW supply lines by the controller.

A $H_2O_2$ flow line 636 connects with an outlet of the three-way valve 616 that is connected with the $H_2O_2$ supply line. Flow line 636 extends from three-way valve 616 to connect with flow line 634 at a location that is between concentration sensor(s) 632 and second static mixer 640. Optionally, flow line 636 can include a flow control valve 638 that can be automatically controlled by controller 126 to enhance flow control of hydrogen peroxide fed to the second static mixer. The second static mixer 640 mixes the DIW diluted $NH_4OH$ solution received from the first static mixer 630 with the $H_2O_2$ solution flowing from the $H_2O_2$ feed line to form a mixed and generally uniform SC-1 cleaning solution of ammonium hydroxide, hydrogen peroxide and de-ionized water. A flow line 642 receives the mixed cleaning solution from the second static mixture and connects with an inlet of an electronic three-way valve 648.

Disposed along flow line 642, at a location upstream from valve 648, is at least one suitable concentration sensor 644 (e.g., one or more electrode-less sensors or RI detectors of any of the types described above) that determines the concentration at least one of hydrogen peroxide and ammonium hydroxide in the cleaning solution. Concentration sensor(s) 644 is also in communication with controller 126 to provide measured concentration information to the controller, which in turn facilitates control of the concentration of ammonium hydroxide and/or hydrogen peroxide in the cleaning solution by selective and automatic manipulation of any of the valves in one or more of the $NH_4OH$, $H_2O_2$ and DIW feed lines by the controller. Optionally, a pressure regulator 646 can be disposed along flow line 642 between sensor 644 and valve 648 so as to control the pressure and flow of cleaning solution.

A drain line 650 connects with an outlet of three-way valve 648, while flow line 652 extends from another outlet port of three-way valve 648. The three-way valve is selectively and automatically manipulated by controller 126 to facilitate control of the amount of cleaning solution that emerges from the blender unit for delivery to tank 502 and the amount that is diverted to drain line 650. In addition, an electronic valve 654 is disposed along flow line 652 and is automatically controlled by controller 126 to further control flow of cleaning solution from the blender unit to tank 502. Flow line 652 becomes flow line 512 as shown in FIG. 5 for delivery of SC-1 cleaning solution to tank 502.

The series of electronic valves and concentration sensors disposed within blender unit 108 in combination with controller 126 facilitate precise control of the flow rate of cleaning solution to the tank and also the concentrations of hydrogen peroxide and ammonium peroxide in the cleaning solution at varying flow rates of the cleaning solution during system operation. Further, the concentration monitor unit 528 disposed along the drain line 522 for tank 502 provides an indication to the controller when the concentration of one or both the hydrogen peroxide and ammonium peroxide falls outside of an acceptable range for the cleaning solution.

Based upon concentration measurements provided by concentration monitor unit 528 to controller 126, the controller may be programmed to implement a change in flow rate of cleaning solution to the tank and to open drain valve 520 so as to facilitate a rapid displacement of SC-1 cleaning solution in the bath while supplying fresh SC-1 cleaning solution to the tank, thus bringing the cleaning solution bath within compliant or target concentration ranges as quickly as possible. Once cleaning solution has been sufficiently displaced from the tank such that the hydrogen peroxide and/or ammonium hydroxide concentrations fall within acceptable ranges (as measured by concentration monitor unit 528), the controller is programmed to close drain valve 520 and to control the blender unit so as to reduce (or cease) the flow rate while maintaining the desired compound concentrations within the cleaning solution being delivered to the tank 502.

An exemplary embodiment of a method of operating the system described above and depicted in FIGS. 5 and 6 is described below. In this exemplary embodiment, cleaning solution can be continuously provided to the tank or, alternatively, provided only at selected intervals to the tank (e.g., when cleaning solution is to be displaced from the tank). An SC-1 cleaning solution is prepared in blender unit 108 and provided to tank 502 with a concentration of ammonium hydroxide in a range from about 0.01-29% by weight, preferably about 1.0% by weight, and a concentration of hydrogen peroxide in a range from about 0.01-31% by weight, preferably about 5.5% by weight. The cleaning tank 502 is configured to maintain about 30 liters of cleaning solution bath within the tank at a temperature in the range from about 25° C. to about 125° C.

In operation, upon filling the tank 502 with cleaning solution to capacity, the controller 126 controls blender unit 108 to provide cleaning solution to tank 502 via flow line 512 at a first flow rate from about 0-10 liters per minute (LPM), where the blender can provide solution continuously or, alternatively, at selected times during system operation. When the solution is provided continuously, an exemplary first flow rate is about 0.001 LPM to about 0.25 LPM, preferably about 0.2 LPM. Ammonium hydroxide supply line 506 provides a feed supply of about 29-30% by volume $NH_4OH$ to the blender unit, while hydrogen peroxide supply line 508 provides a feed supply of about 30% by volume $H_2O_2$ to the blender unit. At a flow rate of about 0.2 LPM, the flow rates of the supply lines of the blender unit can be set as follows to ensure a cleaning solution is provided having the desired concentrations of ammonium hydroxide and hydrogen peroxide: about 0.163 LPM of DIW, about 0.006 LPM of $NH_4OH$, and about 0.031 LPM of $H_2O_2$.

Additives (e.g., APS) can optionally be added to the cleaning solution via supply line 514. In this stage of operation, a continuous flow of fresh SC-1 cleaning solution can be provided from the blender unit 108 to tank 502 at the first flow rate, while cleaning solution from the cleaning bath is also exiting tank 502 via overflow line 516 at generally the same flow rate (i.e., about 0.2 LPM). Thus, the volume of the cleaning solution bath is maintained relatively constant due to the same or generally similar flow rates of cleaning solution to and from the tank. The overflow cleaning solution flows into drain line 522 and through concentration monitor unit 528, where concentration measurements of one or more compounds (e.g., $H_2O_2$ and/or $NH_4OH$) within the cleaning solution are determined continuously or at selected time intervals, and such concentration measurements are provided to controller 126.

Cleaning solution can optionally be circulated by adjusting valve 532 such that cleaning solution flowing from tank 502 flows through recirculation line 526 and back into the tank at a selected flow rate (e.g., about 20 LPM). In such operations, blender unit 108 can be controlled such that no cleaning solution is delivered from the blender unit to the tank unless the concentrations of one or more compounds in the cleaning solution are outside of selected target ranges. Alternatively, cleaning solution can be provided by the blender unit at a selected flow rate (e.g., about 0.20 LPM) in combination with the recirculation of cleaning solution through line 526. In this alternative operating embodiment, three-way valve 532 can be adjusted (e.g., automatically by controller 126) to facilitate removal of cleaning solution into line 534 at about the same rate as cleaning solution being provided to the tank by the blender unit, while cleaning solution still flows through recirculation line 526. In a further alternative, valve 532 can be closed to prevent any recirculation of fluid through line 526 while cleaning solution is continuously provided to tank 502 by blender unit 108 (e.g., at about 0.20 LPM). In this application, solution exits the tank via line 516 at about the same or similar flow rate as the flow rate of fluid into the tank from the blender unit.

For applications in which cleaning solution is continuously provided to the tank, controller 126 maintains the flow rate of cleaning solution from blender unit 108 to tank 502 at the first flow rate, and the concentrations of hydrogen peroxide and ammonium hydroxide within the selected concentration ranges, so long as the measured concentrations provided by the concentration monitor unit 528 are within acceptable ranges. For applications in which cleaning solution is not continuously provided from the blender unit to the tank, controller 126 maintains this state of operation (i.e., no cleaning solution from blender unit to tank) until a concentration of hydrogen peroxide and/or ammonium hydroxide are outside of the selected concentration ranges.

When the concentration of at least one of hydrogen peroxide and ammonium hydroxide, as measured by concentration monitor unit 528, deviates outside of the acceptable range (e.g., the measured concentration of $NH_4OH$ deviates from the range of about 1% relative to a target concentration, and/or the measured concentration of $H_2O_2$ deviates from the range of about 1% relative to a target concentration), the controller manipulates and controls any one or more of the valves in blender unit 108 as described above to initiate or increase the flow rate of cleaning solution from the blender unit to tank 502 (while maintaining the concentrations of $NH_4OH$ and $H_2O_2$ in the cleaning solution within the selected ranges) to a second flow rate.

The second flow rate can be in a range from about 0.001 LPM to about 20 LPM. For continuous cleaning solution operations, an exemplary second flow rate is about 2.5 LPM. The controller further opens drain valve 520 in tank 502 to facilitate a flow of cleaning solution from the tank at about the same flow rate. At the flow rate of about 2.5 LPM, the flow rates of the supply lines of the blender unit can be set as follows to ensure a cleaning solution is provided having the desired concentrations of ammonium hydroxide and hydrogen peroxide: about 2.04 LPM of DIW, about 0.070 LPM of $NH_4OH$, and about 0.387 LPM of $H_2O_2$.

Alternatively, cleaning solution that is being recirculated to the tank at a selected flow rate (e.g., about 20 LPM) is removed from the system by adjusting three-way valve 532 so that cleaning fluid is diverted into line 534 and no longer flows into line 526, and the blender unit adjusts the second flow rate to a selected level (e.g., 20 LPM) so as to compensate for the removal of fluid at the same or similar flow rate. Thus, the volume of cleaning solution bath within tank 502 can be maintained relatively constant during the increase in flow rate of cleaning solution to and from the tank. In addition, the process temperature and circulation flow parameters within the tank can be maintained during the process of replacing a selected volume of the solution within the tank.

The controller maintains delivery of the cleaning solution to tank 502 at the second flow rate until concentration monitor unit 528 provides concentration measurements to the controller that are within the acceptable ranges. When the concentration measurements by concentration monitor unit 528 are within the acceptable ranges, the cleaning solution bath is again compliant with the desired cleaning compound concentrations. The controller then controls blender unit 108 to provide the cleaning solution to tank 502 at the first flow rate (or with no cleaning solution being provided to the tank from the blender unit), and the controller further manipulates drain valve 520 to a closed position so as to facilitate flow of cleaning solution from the tank only via overflow line 516. In applications in which the recirculating line is used, the controller manipulates three-way valve 532 such that cleaning solution flows from line 522 into line 526 and back into tank 502.

Thus, the point-of-use process control blender system described above is capable of effectively and precisely controlling the concentration of at least two compounds in a cleaning solution delivered to a chemical solution tank (e.g., a tool or a solution tank) during an application or process despite potential decomposition and/or other reactions that may modify the chemical solution concentration in the tank. The system is capable of continuously providing fresh chemical solution to the tank at a first flow rate, and rapidly displacing chemical solution from the tank with fresh chemical solution at a second flow rate that is faster than the first flow rate when the chemical solution within the tank is determined to have undesirable or unacceptable concentrations of one or more compounds.

The point-of-use process control blender systems are not limited to the exemplary embodiments described above and depicted in FIGS. 5 and 6. Rather, such systems can be used to provide chemical solutions with mixtures of any two or more compounds such as the types described above to any semiconductor processing tank or other selected tool, while maintaining the concentrations of compounds within the chemical solutions within acceptable ranges during cleaning applications.

In addition, the process control blender system can be implemented for use with any selected number of solution tanks or tanks and/or semiconductor process tools. For example, a controller and blender unit as described above can be implemented to supply chemical solution mixtures with precise concentrations of two or more compounds directly to two or more process tools. Alternatively, the controller and blender unit can be implemented to supply such chemical solutions to one or more holding or storage tanks, where such storage tanks supply chemical solutions to one or more process tools (such as in the system 400 shown in FIG. 4). The process control blender system provides precise control of the concentrations of compounds in the chemical solutions by monitoring the concentration of solution(s) within the tank or tanks, and replacing or replenishing solutions to such tanks when the solution concentrations fall outside of target ranges.

The design and configuration of the process control blender system facilitates placement of the system in substantially close proximity to the one or more chemical solution tanks and/or process tools which are to be provided with chemical solution from the system. In particular, the process control blender system can be situated in or near the fabrication (fab) or clean room or, alternatively, in the sub-fab room but proximate where the solution tank and/or tool is located in the clean room. For example, the process control blender system, including the blender unit and controller, can be situated within about 30 meters, preferably within about 15 meters, and more preferably within about 3 meters or less, of the solution tank or process tool. Further, the process control blender system can be integrated with one or more tools so as to form a single unit including the process blender system and tool(s).

Off-Board Blenders

As mentioned above, the blender 108 may be located off-board, according to one embodiment. That is, the blender 108 may be decoupled from the processing station(s) being serviced by the blender 108, in which case the blender 108 may then be remotely located, e.g., in a sub-fab.

Figure 7:
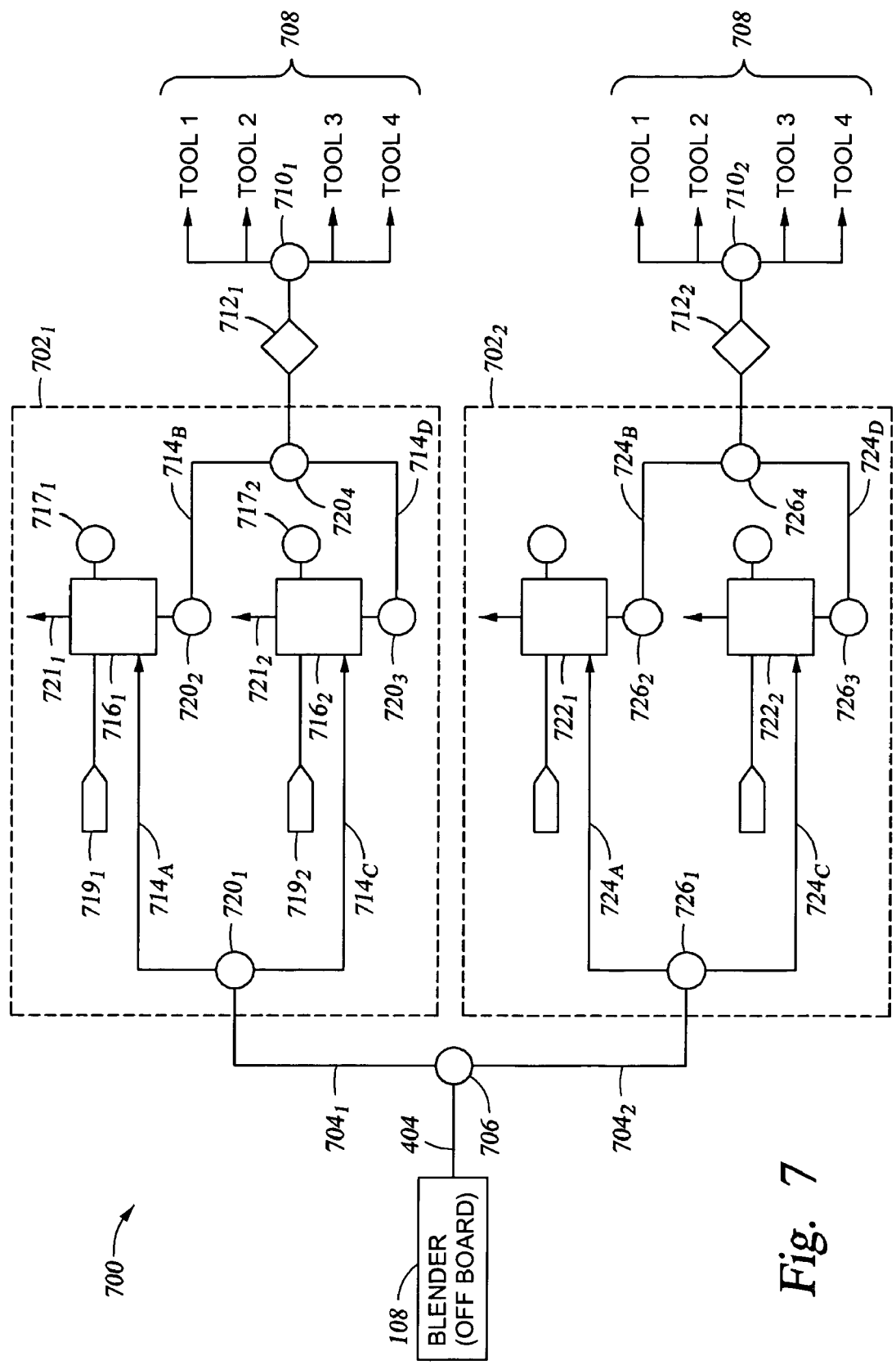
FIG. 7 is a diagram of a processing system having an off-board blender, according to one embodiment of the present invention.

In a particular embodiment of an off-board blender, a centralized blender is configured for servicing a plurality of tools. One such centralized blender system 700 is shown in FIG. 7. In general, the blender system 700 includes a blender 108 and one or more filling stations $702_{1-2}$. In the illustrative embodiment two filling stations $702_{1-2}$ (collectively filling stations 702) are shown. The blender 108 may be configured as in any of the embodiments previously described (e.g., as described above with respect to FIG. 6). The blender 108 is fluidly coupled to the filling stations 702 by a primary supply line 404 and a pair of flow lines $704_{1-2}$ coupled at their respective ends to one of the filling stations $702_{1-2}$. A flow control unit 706 is disposed at the junction of the primary supply line and the flow lines $704_{1-2}$. The flow control unit 706 is representative of any number of devices suitable for controlling aspects of fluid flow between the blender 108 and the filling stations 702. For example, the flow control unit 706 may include a multi-way valve for controlling the routing of the solution from the blender 108 to a downstream destination. Accordingly, the flow control unit 408 can selectively (e.g., under the control of the controller 126) route the solution from the blender 108 to the first filling station $702_1$ via the first flow line $704_1$ and to the second filling station $702_2$ via the second flow line $704_2$. The flow control unit 706 may also include flow meters or flow controllers.

Each of the filling stations 702 is coupled to one or more processing tools 708. In the illustrative embodiment, the filling stations are each coupled to four tools (Tools 1-4), although more generally the filling stations may be coupled to any number of points of use. Routing (and/or metering, flow rate, etc.) of the solutions from the filling stations 702 may be controlled by flow control units $710_{1-2}$ disposed between the respective filling stations and the plurality of tools 708. In one embodiment, filters $712_{1-2}$ are disposed between the respective filling stations and the plurality of tools 708. The filters $712_{1-2}$ are selected to remove debris from the solution prior to being delivered to the respective tools.

In one embodiment, each filling station 702 supplies a different chemistry to the respective tools 708. For example, in one embodiment the first filling station $702_1$ supplies diluted hydrofluoric acid, while the second filling station $702_2$ supplies a SC-1 type solution. Flow control devices at the respective tools may be operated to route the incoming solutions to appropriate processing stations/chambers of the tools.

In one embodiment, each of the filling stations may be operated asynchronously with respect to the blender 108. That is, each filling station $702_{1-2}$ may be filled while simultaneously dispensing a solution to one or more of the tools 708. To this end, each filling station is configured with a filling loop having at least two vessels disposed therein. In the illustrative embodiment, the first filling station has a first filling loop $714_{A-D}$ with two vessels $716_{1-2}$. The filling loop is defined by a plurality of flow line segments. A first flow line segment $714_A$ fluidly couples the flow line 704 with the first vessel $716_1$. A second flow line segment $714_B$ fluidly couples the first vessel $716_1$ to the processing tools 708. A third flow line segment $714_C$ fluidly couples the flow line 704 with the second vessel $716_2$. A fourth flow line segment $714_D$ fluidly couples the second vessel $716_2$ to the processing tools 708. A plurality of valves $720_{1-4}$ are disposed in the filling loop to control fluid communication between the blender 108 and the vessels 716, and between the vessels 716 and the plurality of tools 708.

Each of the vessels 716 have an appropriate number of level sensors $717_{1-2}$ (e.g., a high level sensor and a low level sensor) in order to sense a fluid level within the respective vessel. Each of the vessels also has a pressurizing gas input $719_{1-2}$, whereby the respective vessel may be pressurized, and a vent $721_{1-2}$, whereby the respective vessel may be depressurized. Although not shown, the filling loop $714_{A-D}$ of the first processing station $702_1$ may be equipped with any number of flow management devices, such as pressure regulators, flow controllers, flow meters, etc.

The second filling station 702 is likewise configured. Accordingly, the second filling station 702 of FIG. 7 is shown having two vessels $722_{1-2}$ disposed in a filling loop $724_{A-D}$ having a plurality of valves $726_{1-4}$ for controlling fluid communication.

In operation, the controller 126 may operate the flow control unit 706 to establish communication between the blender 108 and the first filling station $702_1$. The controller 126 may also operate the first filling loop valve $720_1$ to establish fluid communication between the first flow line $704_1$ and the first flow line segment $714_A$ of the filling loop $714_{A-D}$, thereby establishing fluid communication between the blender 108 and the first vessel $716_1$. In this configuration, the blender 108 may flow a solution to the first vessel $716_1$ until an appropriate one of the sensors $717_1$ (i.e., a high level sensor) indicates that the vessel is full, at which point the first filling loop valve is closed $720_1$ and the vessel $716_1$ may be pressurized by application of a gas to the pressurizing gas input $719_1$. Prior to and during filling the first vessel, the respective vent $721_1$ may be open to allow the vessel to depressurize.

While the first vessel $716_1$ is being filled, the filling station $702_1$ may be configured such that the second vessel $716_2$ is dispensing solution to one or more of the tools 708. Accordingly, the second valve $720_2$ is closed, the third valve $720_3$ is open, and the fourth valve $720_2$ is set to a position allowing fluid communication between the second vessel $716_2$ and the processing tools 708 via the fourth flow line segment $714_D$.

During dispensation of solution, the second vessel may be under pressure by application of a pressurizing gas to the respective gas input $721_2$.

Upon determining that the fluid level in second vessel $716_2$ has reached a predetermined low level, as indicated by an appropriate low level sensor $717_2$, the filling station 702 may be configured to halt dispensation from the second vessel $716_2$ and begin dispensation from the first vessel $716_1$ by setting the valves of the first filling loop to appropriate positions. The second vessel $716_2$ may then be depressurized by opening the respective vent $721_2$, after which the second vessel $716_2$ may be filled by solution from the blender 108.

The operation of the second filling station $702_2$ is identical to the operation of the first filling station $702_1$ and, therefore, will not be described in detail.

After filling a vessel in one of the filling stations $702_{1-2}$, the filling station will be capable of dispensing a solution to one or more of the tools 708 for a period of time. During this time, the flow control unit 706 may be operated to place the blender 108 in fluid communication with the other filling station. It is contemplated that the vessels of the filling stations may be sized in capacity such that, for given flow rates into and out of the filling stations, the blender 108 may refill one of the vessels of one of the filling stations before the standby vessel of the other filling station is depleted. In this way, solution dispensation from the filling stations may be maintained with no interruption, or substantially no interruption.

Reclamation Systems

Figure 8A:
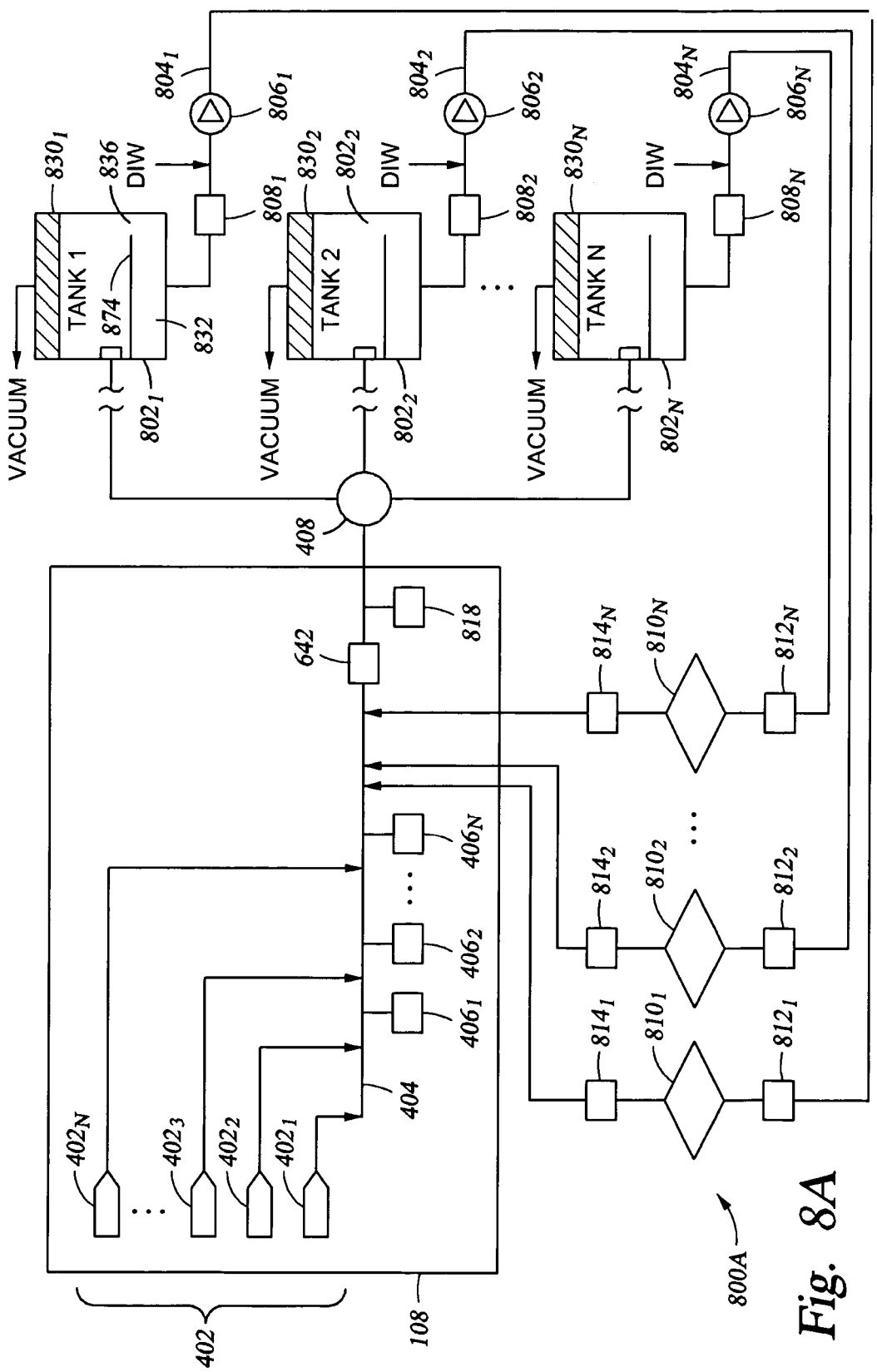
FIG. 8A is a diagram of a processing system having a reclamation system, according to one embodiment of the present invention.

As noted above, in one embodiment of the present invention, fluids removed from processing stations (or, more generally, points of use) are reclaimed and reused. Referring now to FIG. 8A, one embodiment of a reclamation system 800A is shown. The reclamation system 800A includes a number of components previously described with respect to FIG. 4, and those components are identified by like numbers and will not be described again in detail. Further, for clarity a number of items previously described have been removed. In general, the reclamation system 800A includes the blender 108 and a plurality of tanks $802_{1-N}$ (collectively tanks 802). The tanks 802 correspond to the tank 436 shown in FIG. 4 and, therefore, each tank is fluidly coupled to a respective processing station (not shown) and may also be fluidly coupled to the vacuum pump subsystem 120 (not shown).

In one embodiment, the tanks 802 are configured to separate liquids from gases in the incoming liquid-gas streams. To this end, the tanks 802 may each include an impingement plate $828_{1-N}$ at an inlet of the respective tanks. Upon encountering the impingement plate 828, liquid is condensed out of the incoming fluid streams by operation of blunt force. The tanks 802 may also include demisters $830_{1-N}$. The demisters 830 generally include an array of surfaces positioned at angles (e.g., approximately 90 degrees) relative to the fluid being flowed through the demister 830. Impingement with the demister surfaces causes further condensation of liquid from the gas. Liquid condensed from the incoming stream is captured in a liquid storage area $832_{1-N}$ at a lower portion of the tanks, while any remaining vapor is removed to the vacuum pump subsystem 120 (shown in FIG. 1). In one embodiment, a degassing baffle $834_{1-N}$ is positioned below the demisters, e.g., just below the impingement plates 828. The degassing baffle extends over the liquid storage area 832 and forms an opening $836_{1-N}$ at one end. In this configuration the degassing baffle allows liquid to enter the liquid storage area 832 via the opening 836, but prevents moisture from the liquid from being reintroduced with the incoming liquid-gas stream.

Each of the tanks 802 is fluidly coupled to the blender 108 via a respective reclamation line $804_{1-N}$ (collectively reclamation lines 804). Fluid flow is motivated from the tanks through their respective reclamation lines 804 by the provision of a respective pump $806_{1-N}$ (collectively pump 806). Fluid communication between the tanks 802 and their respective pumps 806 is controlled by operation of pneumatic valves $808_{1-N}$ (collectively valves 808) disposed in the reclamation lines 804. In one embodiment, the pumps 806 are centrifugal pumps or suitable alternatives such as air operated diaphragm or bellows pumps.

In one embodiment, filters $810_{1-N}$ (collectively filters 810) are disposed in each of the reclamation lines. The filters 810 are selected to remove debris from the reclaimed fluids prior to being introduced into the blender 108. Although not shown, the filters may each be coupled to a flushing system configured to flow a flushing fluid (e.g., DIW) through the filters to remove and carry away the debris caught by the filters. Fluid flow into the filters and into the blender 108 may be managed (e.g., controlled and/or monitored) by the provision of one or more flow management devices. Illustratively, flow management devices $812_{1-N}$, $814_{1-N}$ are disposed in the respective reclamation lines upstream and downstream of the filters. For example, in the illustrative embodiment, the upstream devices $812_{1-N}$ are pneumatic valves (collectively valves 812) are disposed upstream of each of the filters 810. Accordingly, the flow rates of the reclamation fluids may be controlled by operation of the pneumatic valves 812. Further, the downstream devices $814_{1-N}$ include pressure regulators and flow control valves to ensure a desired pressure and flow rate of the fluids being introduced to the blender 108. Each of the flow management devices may be under the control of the controller 126 (shown in FIG. 4).

Each of the reclamation lines 804 terminate at the primary supply line 404 of the blender 108. Accordingly, each of the fluids flowed from the respective tanks may be streamed into and mixed with the solution being flowed through the primary supply line 404. In one embodiment, the reclamation fluids are introduced upstream from a mixing station (e.g., mixer 642 described above with respect to FIG. 6) disposed in line with the primary supply line 404. Further, one or more concentration monitors 818 may be disposed along the primary supply line 404 downstream from the mixer 642. Although only one concentration monitor is shown for convenience, it is contemplated that a concentration monitor is provided for each different chemistry being reclaimed, in which case the reclamation streams may be introduced into the primary supply line 404 at an appropriate point upstream from a respective concentration monitor for the particular stream. In this way, the concentration of a respective chemistry may be monitored at the respective concentration monitor. If the concentration is not within a target range, the blender 108 may operate to inject calculated amounts of the appropriate chemical(s) from the various inputs 402. The resulting solution is then mixed at the mixer 642 and again monitored for concentration at the concentration monitor 818. This process may be continued, while diverting the solution to drain, until the desired concentrations are achieved. The solution may then be flowed to the appropriate point of use.

In some configurations, the chemistries being used at each of the respective processing stations may always be the same. Accordingly, in one embodiment, the various reclamation lines 804 may be input to the appropriate point of use supply lines 410, 412, 414, as is illustrated by the reclamation system 800B shown in FIG. 8B. Although not shown, concentration monitors may be disposed along each of the reclamation lines to monitor the respective concentrations of the reclamation streams being input to the point of use supply lines. Although not shown, mixing zones may be disposed along the point of use supply lines 410, 412, 414 to mix the incoming reclamation streams with the stream from the blender 108. Also, suitable mixing of streams may be achieved by delivering the stream from the blender 108 and the respective reclamation streams at 180 degrees relative to each other. The incoming streams may be mixed at a T-junction coupling, whereby the resulting mixture is flowed toward the respective points of use at 90 degrees relative to the flow paths of the incoming streams.

Figure 8B:
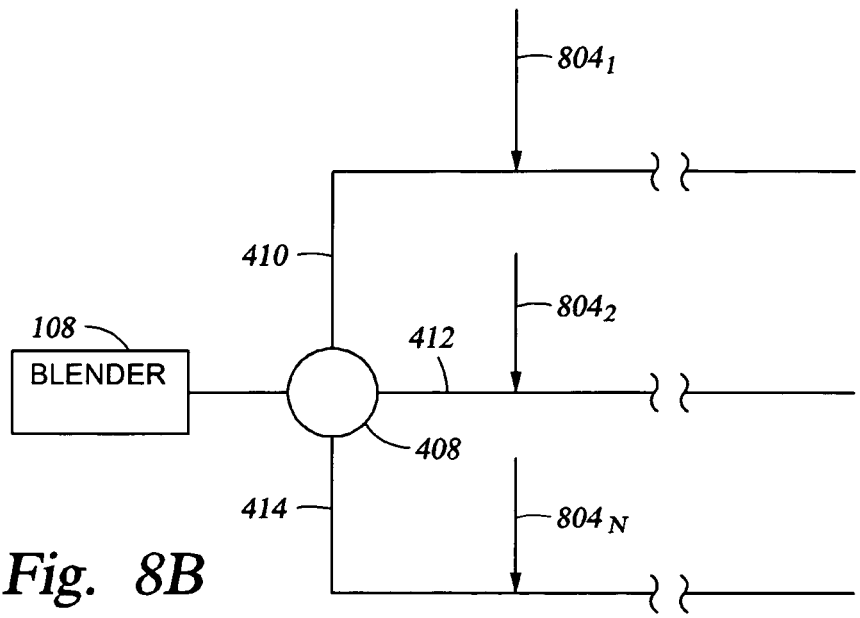
FIG. 8B is a diagram of a processing system having a reclamation system, according to one embodiment of the present invention.
Figure 8C:
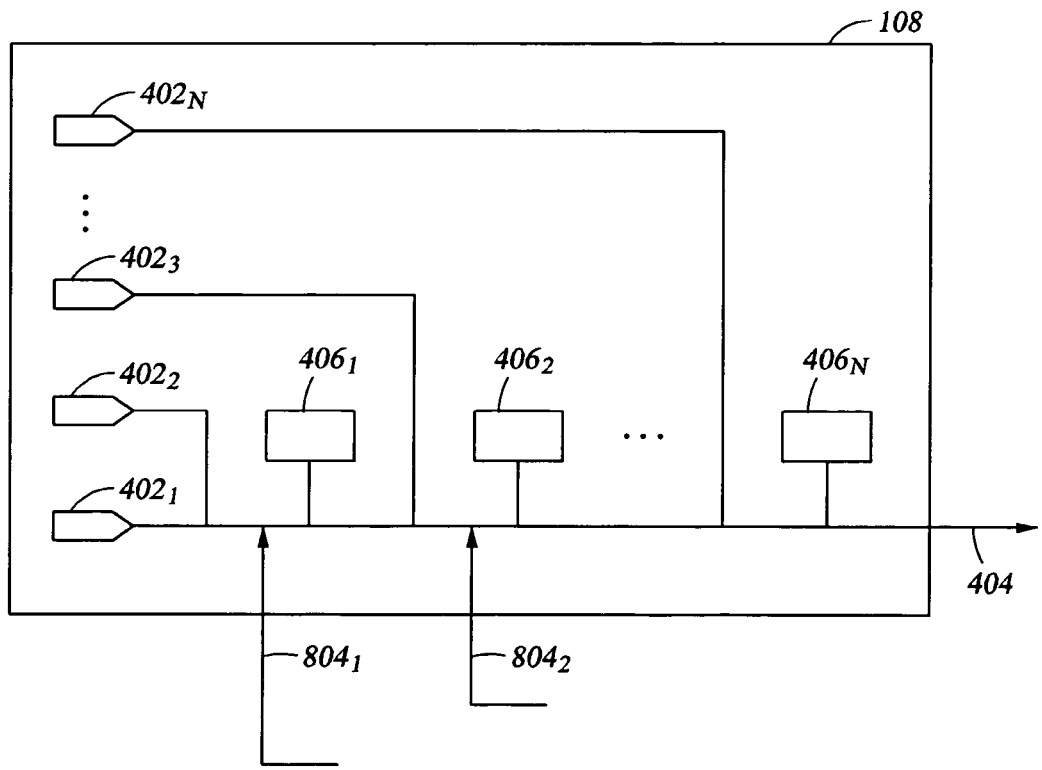
FIG. 8C is a diagram of a processing system having a reclamation system, according to one embodiment of the present invention.

Alternatively, it is contemplated to flow each of the reclamation fluids to a point upstream of the appropriate concentration monitor in the blender 108, as is illustrated by the reclamation system 800C shown in FIG. 8C. For example, a reclaimed solution of diluted hydrofluoric acid from the first reclamation line $804_1$ may be input downstream of a hydrofluoric acid input $402_1$ and upstream of the first concentration monitor $406_1$ configured to monitor the concentration of hydrofluoric acid. A reclaimed solution of SC-1 type chemistry from the second reclamation line $804_2$ may be input downstream of the ammonium hydroxide input $402_2$ and hydrogen peroxide input $402_3$, and upstream of the second and third concentration monitors $406_2$, $406_N$ configured to monitor the concentration of SC-1 type solution constituents. And so on. In one embodiment, distinguishing between various constituents in a mixture of multiple constituents, such as ammonium hydroxide and hydrogen peroxide, is possible by deriving an equation from process modeling using metrology signals and analytical results from titrations. The incoming chemical concentration to the process must be known; more specifically, the concentration of the fluid must be known before decompositions, escape of the $NH_3$ molecule, or formation of any resultant salts or by-products from the chemical processes occurring. In this way, the changing metrology can be observed and the change in components typical for that process can be predicted.

In each of the foregoing embodiments, the reclamation fluids may be filtered and monitored for appropriate concentrations. However, after some amount of time and/or some number of process cycles the reclaimed fluids will no longer be viable for their intended use. Accordingly, and the one embodiment, the solutions from the tanks 804 are only recirculated and reused for a limited time and/or a limited number of process cycles. In one embodiment, the process cycles are measured in number of wafers processed. Thus, in a particular embodiment, a solution of a given chemistry for a given process station is reclaimed and reused for N wafers, where N is some predetermined integer. After N wafers have been processed, the solution is diverged to drain.

It should be understood that the reclamation systems 800A-C shown in FIGS. 8A-C are merely illustrative of one embodiment. Persons skilled in the art will recognize other embodiments within the scope of the present invention. For example, in another embodiment of the reclamation systems 800A-C, fluids may be alternatively routed from the tanks 802 to an off-board reclamation facility located, e.g., in the sub-fab. To this end, appropriate flow control devices (e.g., pneumatic valves) may be disposed in the respective reclamation lines 804.

Vacuum Pump Subsystem

Figure 9:
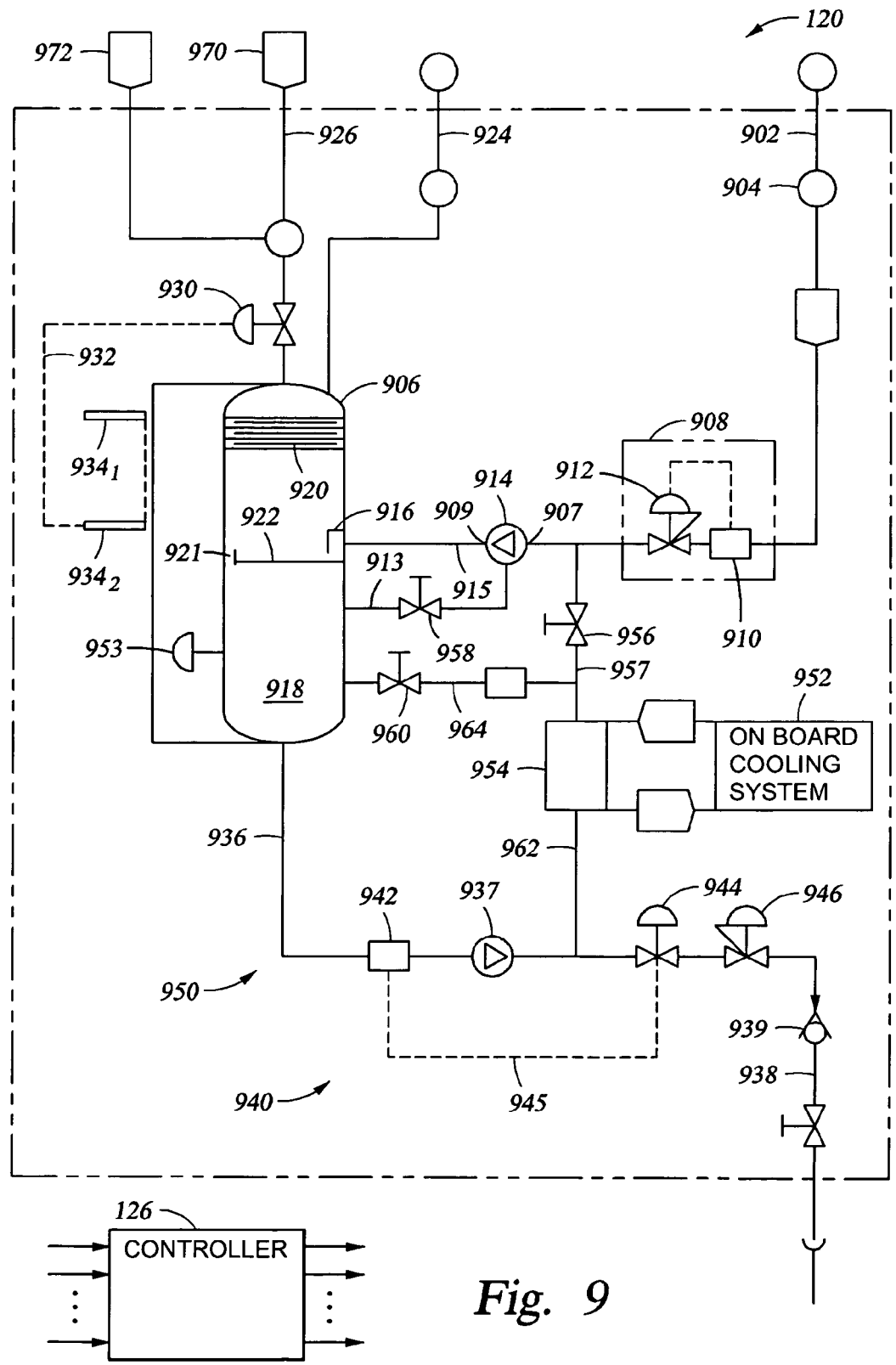
FIG. 9 is a diagram of a vacuum pump system, according to one embodiment of the present invention.

Referring now to FIG. 9, one embodiment of the vacuum pump subsystem 120 is shown. In general, the vacuum pump subsystem 120 may operate to collect waste fluids and separate gases from fluids to facilitate waste management. Accordingly, the vacuum pump subsystem 120 is coupled to each of the vacuum tanks 436, 438 (shown in FIG. 4) and vacuum tank 802 (shown in FIG. 8) by a vacuum line 902. Thus, the vacuum line 902 may be coupled to the respective vacuum lines 444 and 446 shown in FIG. 4. Although not shown in FIG. 9, one or more valves may be disposed in the vacuum line 902 and/or the respective vacuum lines (e.g., lines 444 and 446 shown in FIG. 4) of the vacuum tanks, whereby a vacuum may be selectively placed on the respective tanks. Further, a vacuum gauge 904 may be disposed in the vacuum line 902 in order to measure the pressure in the vacuum line 902.

In one embodiment, an active pressure control system 908 is disposed in the vacuum line 902. In general, the active pressure control system 908 operates to maintain a desired pressure in the vacuum line 902. Controlling the pressure in this way may be desirable to ensure process control over processes being performed in the respective processing stations 204 (shown in FIG. 4, for example). For example, assuming a process being performed in a given processing station 204 requires that a pressure of 400 Torr be maintained in the vacuum line 902, the active pressure control system 908 is operated under PID control (in cooperation with the controller 126) to maintain the desired pressure.

In one embodiment, the active pressure control system 908 includes a pressure transmitter 910 and a pressure regulator 912, which are an electrical communication with each other. The pressure transducer 910 measures the pressure in the vacuum line 902 and then issues a signal to the pressure regulator 912, causing the pressure regulator 912 to open or close a respective variable orifice, depending on a difference between the measured pressure and the set (desired) pressure.

In one embodiment, the vacuum placed on the vacuum line 902 is generated by a pump located downstream from the active pressure control system 908. In a particular embodiment, the pump 914 is a liquid ring pump. A liquid ring pump may be particularly desirable because of its ability to safely handle surges and steady streams of liquids, vapors and mists. While the operation of liquid ring pumps is well-known, a brief description is provided here. It is understood, however, that embodiments of the present invention are not limited to the particular operational or structural aspects of liquid ring pumps.

In general, a liquid ring pump operates to remove gases and mists by the provision of an impeller rotating freely in an eccentric casing. The vacuum pumping action is accomplished by feeding a liquid, usually water (called sealant fluid), into the pump. In the illustrative embodiment, the sealant fluid is provided by a tank 906, which is fluidly coupled to the pump 914 by a feed line 913. Illustratively, a valve 958 is disposed in the feed line 913 in order to selectively isolate the tank 906 from the pump 914. As the sealant fluid enters the pump during operation, the sealant fluid is urged against the inner surface of the pump 914 casing by the rotating impeller blades to form a liquid piston which expands in the eccentric lobe of the pump's casing, thereby creating a vacuum. When gas or vapor (from the incoming stream) enters the pump 914 at a suction port 907 of the pump 914, to which the vacuum line 902 is coupled, the gas/vapor is trapped by the impeller blades and the liquid piston. As the impeller rotates, the liquid/gas/vapor is pushed inward by the narrowing space between the rotor and casing, thereby compressing the trapped gas/vapor. The compressed fluid is then released through a discharge port 909 as the impeller completes its rotation.

The pump 914 is connected at its discharge port 909 to a fluid flow line 915 which terminates at the tank 906. In one embodiment, the tank 906 is configured to further separate liquids from gases in the incoming liquid-gas streams. To this end, the tank 906 may include an impingement plate 916 at an inlet of the tank 906. Upon encountering the impingement plate 916, liquid is condensed out of the incoming fluid streams by operation of blunt force. The tank 906 may also include a demister 920. The demister 920 generally includes an array of surfaces positioned at angles (e.g., approximately 90 degrees) relative to the fluid being flowed through the demister 920. Impingement with the demister surfaces causes further condensation of liquid from the gas. Liquid condensed from the incoming stream is captured in a liquid storage area 918 at a lower portion of the tank 906, while any remaining vapor is removed through an exhaust line 924. In one embodiment, a degassing baffle 922 is positioned below the demister, e.g., just below the impingement plate 916. The degassing baffle 922 extends over the liquid storage area 918 and forms an opening 921 at one end. In this configuration the degassing baffle 922 allows liquid to enter the liquid storage area 918 via the opening 921, but prevents moisture from the liquid from being reintroduced with the incoming liquid-gas stream.

In one embodiment, the sealant fluid contained in the tank 906 is heat exchanged to maintain a desired sealant fluid temperature. For example, in one embodiment it may be desirable to maintain the sealant fluid at a temperature below 10° C. To this end, the vacuum pump subsystem 120 includes a cooling loop 950. A pump 937 (e.g., a centrifugal pump) provides the mechanical motivation to flow the fluid through the cooling loop 950. The cooling loop 950 includes an outlet line 936 and a pair of return lines 962, 964. The first return line 962 fluidly couples the outlet line 936 to an inlet of a heat exchanger 954. The second return line 964 is coupled to an outlet of the heat exchanger 954 and terminates at the tank 906, where the cooled sealant fluid is dispensed into the liquid storage area 918 of the tank 906. Illustratively, a valve 960 is disposed in the second return line 964, whereby the cooling loop 950 may be isolated from the tank 906. In this way, the temperature controlled sealant fluid causes some vapor/mist to condense out of the incoming fluid and into the liquid of the sealant pump 914.

In one embodiment, the heat exchanger 954 is in fluid communication with an onboard cooling system 952. In particular embodiment, the onboard cooling system 952 is a Freon-based cooling system, which flows Freon through the heat exchanger 954. In this context, "onboard" refers to the cooling system 953 being physically integrated with the heat exchanger 954. In another embodiment, the cooling system 953 may be an "off-board" component, such as a stand-alone chiller.

During operation, sealant fluid may be circulated from the tank 906 through the cooling loop 950 on a continual or periodic basis. As the sealant fluid is flowed through the heat exchanger 954, the fluid is cooled and then returned to the tank 906. The heat exchange effected by the heat exchanger 954 (i.e., the temperature to which the sealant fluid is brought) may be controlled by operating the cooling system 952. To this end, a temperature sensor 953 may be placed in communication with the sealant fluid contained in the liquid storage area 918 of the tank 906. Measurements made by the temperature sensor 953 may be provided to the controller 126. The controller 126 may then issue appropriate control signals to the cooling system 952, thereby causing the cooling system 952 to adjust the temperature of the Freon (or other cooling fluid being used). It is also contemplated that the sealant fluid in the liquid storage area 918 may in part be cooled by thermal exchange with the ambient environment of the tank 906. In this way, the sealant fluid may be maintained at a desired temperature.

In one embodiment, cooled sealant fluid from the cooling loop 950 may be injected into the vacuum line 902 upstream from the liquid ring pump 914. Accordingly, the vacuum pump subsystem 120 includes a feed line 957 shown branching from the second return line 964. A valve 956 is disposed in the feed line 957, whereby fluid communication between the cooling loop 950 and the vacuum line 902 may be established or disconnected. While the valve 956 remains open, a portion of the cooled sealant fluid flows from the cooling loop 950 into the vacuum line 902, via the feed line 957. Thus, the cooled sealant fluid enters a stream of gas/liquid flowing through the vacuum line 902 towards the liquid ring pump 914. In this way, the relatively low temperature cooled sealant fluid causes some vapor or mist to condense out of the incoming gas/liquid stream prior to entering the pump 914. In one embodiment, for a temperature of the incoming stream (from the vacuum tanks via the vacuum line 902) between about 80° C., and about 10° C., the temperature of the cooled sealant fluid may be between about 5° C. and about 10° C.

In one embodiment, the vacuum pump subsystem 120 is configured to monitor one more concentrations of constituents in the sealant fluid. Monitoring chemical concentrations may be desirable, for example, to protect any (e.g., metal) components of the liquid ring pump 914, and/or other components of the vacuum pump subsystem 120. To this end, the system 120 shown in FIG. 9 includes an active chemical concentration control system 940 disposed in the cooling loop 950. In the illustrative embodiment, the concentration control system 940 includes a chemical monitor 942 in electrical communication with a pneumatic valve 944, as shown by the bidirectional communication path 945. It should be appreciated, however, that the pneumatic valve 944 may not communicate directly with one another, but rather through the controller 126. During operation, the chemical monitor 942 checks the concentration of one or more constituents of the sealant fluid flowing through the outlet line 936. If a set point of the chemical monitor 942 is exceeded, the chemical monitor 942 (or the controller 126 in response to the signal from the chemical monitor 942) issues a signal to the pneumatic valve 944, whereby the pneumatic valve 944 opens communication to a drain line 938 in order to allow at least a portion of the sealant fluid to drain. In the illustrative embodiment, a check valve 939 is disposed in the drain line 938 to prevent backflow of fluids. Further, a back pressure regulator 946 is disposed in the drain line 938, or at a point upstream from the drain line. The back pressure regulator 946 ensures that a sufficient pressure is maintained in the cooling loop 950, thereby allowing continued flow of sealant fluid through the cooling loop 950.

In one embodiment, the tank 906 is selectively fluidly coupled to one of a plurality of different drains. A particular one of the plurality of drains is then selected on the basis of the make-up (i.e., constituents or concentrations) of the sealant fluid. For example, in the case of a sealant fluid containing a solvent the sealant fluid may be directed to a first drain, while in the case of a non-solvent the sealant fluid may be directed to a second drain. In at least one aspect, this embodiment may serve to avoid deposits being built up in a given drain line that might otherwise occur where, for example, solvents and non-solvents are disposed of through the same drain. Accordingly, it is contemplated that the sealant fluid can be monitored for independent formations of chemical solution such as HF, NH3, HCL or IPA. Each of these chemical solutions can be directed a separate drain (or, some combinations of the solutions may be directed separate drains). In one embodiment, this can be accomplished using a sound velocity sensor to measure the changing density of the solution in the tank 906.

While the tank 906 is being drained (and, more generally, at any time during operation of the system 120), a sufficient level of sealant fluid may be maintained in the tank 906 by provision of an active level control system 928. In one embodiment, the active level control system 928 includes a pneumatic valve 944 disposed in an input line 926, and a plurality of fluid level sensors $934_{1-2}$. The fluid level sensors may include, for example, a high level fluid sensor $934_1$ and a low level fluid sensor $934_2$. The pneumatic valve 944 and the plurality of fluid level sensors $934_{1-2}$ are in electrical communication with each other via the controller 126, as indicated by the dashed communication path 932. In operation, the fluid level in the tank 906 may fall sufficiently to trip the low fluid level sensor $934_2$. In response, the comptroller 126 issues a control signal causing the pneumatic valve 930 to open and allow communication between a first sealant fluid source 970 (e.g., a source of deionized water (DIW)) with the tank 906 via the inlet line 926. Once the fluid in the tank 906 is returned to a level between the high and low level sensors $934_2$, the pneumatic valve 930 is closed.

In addition to maintaining a sufficient level of sealant fluid in the tank 906 while the tank is being drained, the active level control system may also initiate a drain cycle in response to a signal from the high fluid level sensor $934_2$. In other words, should the fluid level in the tank 906 rise sufficiently high to trip the high fluid level sensor, the sensor then issues a signal to the controller 126. In response, the controller 126 issues a signal causing the pneumatic valve 944 to open and allow sealant fluid flow to the drain line 938.

Further, it is contemplated that the tank 906 may be coupled to any number of sealant fluids or additives. For example, in one embodiment the tank 906 is coupled to a neutralizer source 972. The neutralizer may be selected to neutralize various constituents of the incoming steam from the vacuum tanks via the vacuum line 902. In a particular embodiment, the neutralizer is acidic or basic, and is capable of neutralizing bases or acids, respectively. The neutralizer from the neutralizer source 972 may be selectively introduced to the tank 906 by coupling the source 972 to the inlet line 926 at a valve 974. The valve 974 may be configured such that one or both of the sources 970, 972 may be placed in fluid communication with the tank 906.

Various embodiments of a chemical management system have been described herein. However, the disclosed embodiments are merely illustrative and persons skilled in the art will recognize other embodiments within the scope of the invention. For example, a number of the foregoing embodiments provide for a blender 108 which may be located onboard or off-board relative to a processing tool; however, in another embodiment, the blender 108 may be dispensed with altogether. That is, the particular solutions required for a particular process may be provided in ready to use concentrations that do not require blending. In this case, source tanks of the particular solutions may be coupled to the input flow control subsystem 112, shown in FIG. 1 for example.

Accordingly, it is apparent that the present invention provides for numerous additional embodiments, which will be recognized by those skilled in the art, and all of which are in the scoped of the present invention.

What is claimed is:

1. A vacuum pump system, comprising:
   a vacuum line fluidly coupled to at least one of a plurality of fluid outlets of a processing station;
   a liquid ring pump having a suction port coupled to the vacuum line to receive an incoming multiphase stream formed from one or more fluids removed from the plurality of fluid outlets;

a tank coupled to an exhaust port of the liquid ring pump and comprising one or more devices configured for removing liquid from a multiphase stream output by the liquid ring pump through the exhaust port;

a pressure control system disposed in the vacuum line upstream from the liquid ring pump, wherein the pressure control system is configured to maintain a target pressure in the vacuum line according to a desired pressure in the processing station; and a chemical concentration control system configured to:
monitor a concentration of a sealant fluid contained in the tank and fed to the liquid ring pump for the operation of the liquid ring pump; and
direct the sealant fluid to one of a plurality of drains, the drain being selected on the basis of a make-up of the sealant fluid.

2. The system of claim 1, wherein at least one of the one or more devices includes at least one of:
a degassing baffle; and
an impingement plate positioned at an inlet to the tank for receiving the output of the liquid ring pump.

3. The system of claim 1, wherein at least one of the one or more devices includes a demister.

4. The system of claim 1, further comprising a coolant source for injecting a cooling fluid into the incoming multiphase stream prior to the multiphase stream being input to the liquid ring pump, the cooling fluid having a temperature sufficient to condense liquid from the multiphase stream.

5. The system of claim 1, wherein the chemical concentration control system:
selectively adjusts the concentration of the sealant fluid.

6. The system of claim 1, further comprising:
a chemical blender coupled to the processing station and configured to mix a chemical solution for delivery to the processing station.

7. The system of claim 6, further comprising a concentration monitor operable to determine a concentration of at least one of a plurality of chemicals in the solution mixed by the chemical blender.

8. The system of claim 6, further comprising a concentration monitoring system configured to:
determine a concentration of at least one of a plurality of chemicals in the solution mixed by the chemical blender; and
upon determining that the at least one chemical in the solution is not at a predetermined concentration, add an amount of one or more fluids to the chemical blender until the at least one chemical is at the predetermined concentration.

9. The system of claim 8, wherein the chemical monitoring system is configured to prevent the solution being flowed to the processing station until the at least one chemical is that the predetermined concentration.

10. A vacuum pump system, comprising:
a vacuum line fluidly coupled to at least one of a plurality of fluid outlets of a processing station;
a liquid ring pump having a suction port coupled to the vacuum line to receive an incoming multiphase stream formed from one or more fluids removed from the plurality of fluid outlets;
a tank coupled to an exhaust port of the liquid ring pump and comprising one or more devices configured for removing liquid from a multiphase stream output by the liquid ring pump through the exhaust port;
a coolant source for injecting a cooling fluid into the incoming multi-phase stream prior to the multiphase stream being input to the liquid ring pump, the cooling fluid having a temperature sufficient to condense liquid from the multiphase stream; and
a chemical concentration control system configured to:
monitor a concentration of a sealant fluid contained in the tank and fed to the liquid ring pump for the operation of the liquid ring pump; and
direct the sealant fluid to one of a plurality of drains, the drain being selected on the basis of a make-up of the sealant fluid.

11. The system of claim 10, wherein the coolant source is a cooling loop configured for circulating a fluid from the tank to a heat exchanger and then back to the tank; wherein the cooling fluid is the fluid being circulated and is removed from the cooling loop at a point downstream from the heat exchanger.

12. The system of claim 11, further comprising an onboard cooling system configured to provide a coolant to the heat exchanger.

13. The system of claim 10, wherein at least one of the one or more devices includes a demister.

14. The system of claim 10, wherein at least one of the one or more devices includes at least one of:
a degassing baffle; and
an impingement plate positioned at an inlet to the tank for receiving the output of the liquid ring pump.

15. The system of claim 10, further comprising a chemical blender coupled to the processing station and configured to mix a chemical solution for delivery to the processing station.

16. The system of claim 15, further comprising a concentration monitor operable to determine a concentration of at least one of a plurality of chemicals in the solution mixed by the chemical blender.

17. The system of claim 15, wherein the chemical blender comprises a concentration monitoring system configured to:
determine a concentration of at least one of a plurality of chemicals in the solution mixed by the chemical blender; and
upon determining that the at least one chemical in the solution is not at a predetermined concentration, add an amount of one or more fluids to the chemical blender until the at least one chemical is at the predetermined concentration.

18. The system of claim 17, wherein the chemical monitoring system is configured to prevent the solution being flowed to the processing station until the at least one chemical is that the predetermined concentration.

19. A vacuum pump system, comprising:
a vacuum line fluidly coupled to at least one of a plurality of fluid outlets of a processing station;
a liquid ring pump having a suction port coupled to the vacuum line to receive an incoming multiphase stream formed from one or more fluids removed from the plurality of fluid outlets;
a tank coupled to an exhaust port of the liquid ring pump and comprising one or more devices configured for removing liquid from a multiphase stream output by the liquid ring pump through the exhaust port; and
a chemical concentration control system configured to:
monitor a concentration of a sealant fluid contained in the tank and fed to the liquid ring pump for the operation of the liquid ring pump;
selectively adjust a concentration of the sealant fluid; and
direct the sealant fluid to one of a plurality of drains, the drain being selected on the basis of a make-up of the sealant fluid.

20. The system of claim 19, wherein at least one of the one or more devices includes a demister.

21. The system of claim 19, wherein at least one of the one or more devices includes at least one of:
a degassing baffle; and
an impingement plate positioned at an inlet to the tank for receiving the output of the liquid ring pump.

22. The system of claim 19, further comprising:
a chemical blender coupled to the processing station and configured to mix a chemical solution for delivery to the processing station.

23. The system of claim 22, further comprising a concentration monitor operable to determine a concentration of at least one of a plurality of chemicals in the solution mixed by the chemical blender.

24. The system of claim 22, further comprising a concentration monitoring system configured to:
determine a concentration of at least one of a plurality of chemicals in the solution mixed by the chemical blender; and
upon determining that the at least one chemical in the solution is not at a predetermined concentration, add an amount of one or more fluids to the chemical blender until the at least one chemical is at the predetermined concentration.

25. The system of claim 24, wherein the chemical monitoring system is configured to prevent the solution being flowed to the processing station until the at least one chemical is that the predetermined concentration.

26. A vacuum pump system, comprising:
a vacuum line fluidly coupled to at least one of a plurality of fluid outlets of a processing station;
a liquid ring pump having a suction port coupled to the vacuum line to receive an incoming multiphase stream formed from one or more fluids removed from the plurality of fluid outlets;
a tank coupled to an exhaust port of the liquid ring pump and comprising one or more devices configured for removing liquid from a multiphase stream output by the liquid ring pump;
a pressure control system disposed in the vacuum line upstream from the liquid ring pump, wherein the pressure control system is configured to maintain a target pressure in the vacuum line according to a desired pressure in the processing station;
a chemical concentration control system configured to:
monitor a concentration of a sealant fluid contained in the tank and fed to the liquid ring pump for the operation of the liquid ring pump;
selectively adjust a concentration of the sealant fluid; and
direct the sealant fluid to one of a plurality of drains, the drain being selected on the basis of a make-up of the sealant fluid; and
a coolant source for injecting a coolant into the incoming multiphase stream prior to the multiphase stream being input to the liquid ring pump, the coolant having a temperature sufficient to condense liquid from the multiphase stream.

27. The system of claim 26, further comprising:
a chemical blender coupled to the processing station and configured to mix a chemical solution for delivery to the processing station.

28. The system of claim 27, further comprising a concentration monitor operable to determine a concentration of at least one of a plurality of chemicals in the solution mixed by the chemical blender.

29. The system of claim 27, further comprising a concentration monitoring system configured to:
determine a concentration of at least one of a plurality of chemicals in the solution mixed by the chemical blender; and
upon determining that the at least one chemical in the solution is not at a predetermined concentration, add an amount of one or more fluids to the chemical blender until the at least one chemical is at the predetermined concentration.

30. The system of claim 29, wherein the chemical monitoring system is configured to prevent the solution being flowed to the processing station until the at least one chemical is that the predetermined concentration.

31. A processing system, comprising:
a chemical blender configured to be selectively and alternately coupled to fluid inlets associated with a first and a second processing station by operation of a flow control unit, so that while the chemical blender is coupled to a first fluid inlet associated with the first processing station the chemical blender is decoupled from a second fluid inlet associated with the second processing station, and vice versa;
a plurality of fluid outlets from the processing stations; and
a vacuum pump system fluidly coupled to at least one of the plurality of fluid outlets via at least a vacuum line; the vacuum pump system, comprising:
a liquid ring pump having a suction port coupled to the vacuum line to receive an incoming multiphase stream formed from one or more fluids removed from the plurality of fluid outlets; and
a tank coupled to an exhaust port of the liquid ring pump and comprising one or more devices configured for removing liquid from a multiphase stream output by the liquid ring pump through the exhaust port.

32. The system of claim 31, wherein the vacuum pump system further comprises:
a pressure control system disposed in the vacuum line upstream from the liquid ring pump, wherein the pressure control system is configured to maintain a target pressure in the vacuum line according to a desired pressure in the processing stations.

33. The system of claim 31, wherein the vacuum pump system further comprises a chemical concentration control system configured to:
monitor a concentration of a sealant fluid contained in the tank and fed to the liquid ring pump for the operation of the liquid ring pump; and
selectively adjust a concentration of the sealant fluid.

34. The system of claim 30, wherein the vacuum pump system further comprises:
a coolant source for injecting a coolant into the incoming multiphase stream prior to the incoming multiphase stream being input to the liquid ring pump at the suction port, the coolant having a temperature sufficient to condense liquid from the incoming multiphase stream.

35. The system of claim 30, further comprising:
a first supply vessel comprising the first fluid inlet and a first outlet coupled to the first processing station; and
a second supply vessel comprising the second fluid inlet and a second outlet coupled to the second processing station; the first and second fluid outlets being coupled to the chemical blender.

36. The system of claim 30, wherein the chemical blender is configured to mix a first chemical solution for delivery to the first processing station and mix a second chemical solution for delivery to the second processing station.

37. The system of claim 30, wherein the chemical blender comprises a concentration monitor operable to determine a concentration of at least one of a plurality of chemicals in a solution mixed by the chemical blender.

38. The system of claim 30, wherein the chemical blender comprises a concentration monitoring system configured to:
   determine a concentration of at least one of a plurality of chemicals in a solution mixed by the chemical blender; and
   upon determining that the at least one chemical in the solution is not at a predetermined concentration, add an amount of one or more fluids to the chemical blender until the at least one chemical is at the predetermined concentration.

39. The system of claim 38, wherein the chemical monitoring system is configured to prevent the solution being flowed to any of the processing stations until the at least one chemical is that the predetermined concentration.

* * * * *

UNITED STATES PATENT AND TRADEMARK OFFICE
CERTIFICATE OF CORRECTION

PATENT NO.         : 7,871,249 B2
APPLICATION NO.    : 11/549094
DATED              : January 18, 2011
INVENTOR(S)        : K. Urquhart et al.

Page 1 of 1

It is certified that error appears in the above-identified patent and that said Letters Patent is hereby corrected as shown below:

In Column 30, line 16, delete the words "configured to be".

In Column 30, line 18, delete the words "operation of".

In Column 30, line 50, replace the words "claim 30" with the words --claim 31--.

In Column 30, line 57, replace the words "claim 30" with the words --claim 31--.

In Column 30, line 64, replace the words "claim 30" with the words --claim 31--.

In Column 31, line 1, replace the words "claim 30" with the words --claim 31--

In Column 31, line 5, replace the words "claim 30" with the words --claim 31--.

Signed and Sealed this
Twenty-first Day of June, 2011

David J. Kappos
*Director of the United States Patent and Trademark Office*